United States Patent
Bando et al.

(10) Patent No.: US 12,191,878 B2
(45) Date of Patent: *Jan. 7, 2025

(54) SIGNAL PROCESSING CIRCUIT

(71) Applicant: MINEBEA MITSUMI Inc., Nagano (JP)

(72) Inventors: Takahiko Bando, Tokyo (JP); Heisuke Nakashima, Tokyo (JP); Fumihiro Inoue, Tokyo (JP)

(73) Assignee: MINEBEA MITSUMI Inc., Nagano (JP)

( * ) Notice: Subject to any disclaimer, the term of this patent is extended or adjusted under 35 U.S.C. 154(b) by 93 days.

This patent is subject to a terminal disclaimer.

(21) Appl. No.: 17/995,329

(22) PCT Filed: Mar. 30, 2021

(86) PCT No.: PCT/JP2021/013488
§ 371 (c)(1),
(2) Date: Oct. 3, 2022

(87) PCT Pub. No.: WO2021/205939
PCT Pub. Date: Oct. 14, 2021

(65) Prior Publication Data
US 2023/0155601 A1    May 18, 2023

(30) Foreign Application Priority Data
Apr. 9, 2020   (JP) .................. 2020-070473

(51) Int. Cl.
*H03M 1/12*   (2006.01)
*H03M 1/18*   (2006.01)

(52) U.S. Cl.
CPC ......... *H03M 1/1245* (2013.01); *H03M 1/181* (2013.01)

(58) Field of Classification Search
CPC ......... H03M 7/30; H03M 7/46; H03M 7/3088
See application file for complete search history.

(56) References Cited

U.S. PATENT DOCUMENTS

| 4,891,645 A | 1/1990 | Lewis et al. |
| 5,264,804 A | 11/1993 | Fox |

(Continued)

FOREIGN PATENT DOCUMENTS

| JP | S57-123474 | 7/1982 |
| JP | S59-122216 | 7/1984 |

(Continued)

OTHER PUBLICATIONS

Office Action mailed on Aprl 2, 2024 with repect to the corresponding Japanese patent application No. 2020-070473.

(Continued)

*Primary Examiner* — Lam T Mai
(74) *Attorney, Agent, or Firm* — IPUSA, PLLC

(57) ABSTRACT

A signal processing circuit includes a first sampling capacitor and a second sampling capacitor that are connected for an input signal path of an analog signal, and a signal processor configured to perform predetermined processing on the analog signal sampled by the first sampling capacitor and the analog signal sampled by the second sampling capacitor. The sampling of the analog signal transmitted to one capacitor of the first sampling capacitor and the second sampling capacitor, and the predetermined processing performed by the signal processor on the analog signal sampled by another capacitor of the first sampling capacitor and the second sampling capacitor can be performed in parallel.

9 Claims, 16 Drawing Sheets

(56) References Cited

U.S. PATENT DOCUMENTS

| | | | |
|---|---|---|---|
| 5,329,281 | A | 7/1994 | Baumgartner et al. |
| 5,621,409 | A * | 4/1997 | Cotter .................. H03M 1/069 |
| | | | 341/172 |
| 6,097,248 | A | 8/2000 | Segami |
| 6,204,787 | B1 * | 3/2001 | Baird .................... H03M 3/488 |
| | | | 341/139 |
| 7,577,539 | B2 | 8/2009 | Hubanks et al. |
| 8,538,713 | B2 * | 9/2013 | Bilgin ................ H03H 17/0642 |
| | | | 702/57 |
| 8,638,225 | B1 * | 1/2014 | Bocko .................... G07C 3/00 |
| | | | 702/159 |
| 2004/0032626 | A1 | 2/2004 | Rossi |
| 2005/0219111 | A1 * | 10/2005 | Kobayashi .......... H03M 1/1225 |
| | | | 341/172 |
| 2008/0218266 | A1 * | 9/2008 | Kobayashi .......... H03F 3/45475 |
| | | | 330/258 |
| 2008/0252376 | A1 * | 10/2008 | Miao ........................ H03F 1/14 |
| | | | 330/277 |
| 2009/0073020 | A1 * | 3/2009 | Shimizu ................ H03M 1/002 |
| | | | 330/252 |
| 2009/0115507 | A1 * | 5/2009 | Cho ...................... H03M 1/002 |
| | | | 341/172 |
| 2009/0115523 | A1 * | 5/2009 | Akizuki .............. H03F 3/45946 |
| | | | 330/253 |
| 2009/0212867 | A1 * | 8/2009 | Fukuzawa ................ H03G 5/24 |
| | | | 330/284 |
| 2009/0224746 | A1 | 9/2009 | Nishizono |
| 2010/0007542 | A1 * | 1/2010 | Morimoto ........... H03M 1/0695 |
| | | | 341/159 |
| 2010/0164770 | A1 | 7/2010 | Wan et al. |
| 2010/0167669 | A1 | 7/2010 | Hosokawa et al. |
| 2011/0090940 | A1 * | 4/2011 | Wadhwa .............. H03K 5/1565 |
| | | | 327/175 |
| 2011/0205098 | A1 * | 8/2011 | Sabut ...................... H03F 3/005 |
| | | | 330/252 |
| 2011/0221518 | A1 * | 9/2011 | Romero .............. H03H 19/004 |
| | | | 327/554 |
| 2011/0298644 | A1 * | 12/2011 | Ohba ...................... H03F 3/005 |
| | | | 341/155 |
| 2012/0081244 | A1 * | 4/2012 | Lai ...................... H03M 1/1215 |
| | | | 341/122 |
| 2012/0268304 | A1 * | 10/2012 | Lin ........................ H03F 3/005 |
| | | | 341/172 |
| 2013/0033391 | A1 * | 2/2013 | Liu ........................ H03M 1/804 |
| | | | 341/150 |
| 2014/0085117 | A1 * | 3/2014 | Hurrell ............... H03M 1/1245 |
| | | | 341/122 |
| 2015/0249388 | A1 * | 9/2015 | Qu ......................... H02M 3/156 |
| | | | 363/15 |
| 2016/0043733 | A1 * | 2/2016 | Nezuka ................. H03M 3/464 |
| | | | 341/143 |
| 2019/0025052 | A1 * | 1/2019 | Nee .......................... G01D 5/00 |
| 2019/0089365 | A1 | 3/2019 | Yoshioka et al. |
| 2022/0052707 | A1 * | 2/2022 | Pietri .................... H03M 3/496 |

FOREIGN PATENT DOCUMENTS

| | | |
|---|---|---|
| JP | H04-503287 | 6/1992 |
| JP | H05-267991 | 10/1993 |
| JP | H11-298328 | 10/1999 |
| JP | 2006-033304 | 2/2006 |
| JP | 2007-201897 | 8/2007 |
| JP | 2009-200809 | 9/2009 |
| JP | 2009-218796 | 9/2009 |
| JP | 2011-244200 | 12/2011 |
| JP | 2015-128249 | 7/2015 |
| JP | 2019-057759 | 4/2019 |
| JP | 2019-186841 | 10/2019 |
| WO | 2007/142341 | 12/2007 |

OTHER PUBLICATIONS

International Search Report for PCT/JP2021/013488 mailed on Jun. 22, 2021.

Extended European Search Report mailed on Sep. 13, 2023 with regard to the corresponding European patent application No. 21784003.2.

Tsung-Sum Lee et al: "Two 1-V Fully Differential CMOS Switched-Capacitor Amplifiers", Circuits, Systems & Signal Processiong, vol. 29, No. 2, Jan. 5, 2010 (Jan. 5, 2010), pp. 195-207, XP019779874.

Office Action mailed on May 28, 2024 with respect to the related Japanese patent application No. 2020-070472.

International Search Report for PCT/JP2021/013950 mailed on Jun. 8, 2021.

Extended European Search Report mailed on Oct. 10, 2023 with respect to the related European patent application No. 21784931.4.

Office Action mailed on Oct. 15, 2024 with respect to the related Japanese patent application No. 2020-070472.

* cited by examiner

FIG.10

| BINARY CODE | (0.8 pF) | 0.4 pF | 0.2 pF | 0.1 pF | TOTAL CA-PACITANCE [pF] |
| --- | --- | --- | --- | --- | --- |
| | bit3 | bit2 | bit1 | bit0 | |
| 0 | 0 | 0 | 0 | 0 | 0.0 pF |
| 1 | 0 | 0 | 0 | 1 | 0.1 pF |
| 2 | 0 | 0 | 1 | 0 | 0.2 pF |
| 3 | 0 | 0 | 1 | 1 | 0.3 pF |
| 4 | 0 | 1 | 0 | 0 | 0.4 pF |
| 5 | 0 | 1 | 0 | 1 | 0.5 pF |
| 6 | 0 | 1 | 1 | 0 | 0.6 pF |
| 7 | 0 | 1 | 1 | 1 | 0.7 pF |
| 8 | 1 | 0 | 0 | 0 | 0.8 pF |
| 9 | 1 | 0 | 0 | 1 | 0.9 pF |
| 10 | 1 | 0 | 1 | 0 | 1.0 pF |
| 11 | 1 | 0 | 1 | 1 | 1.1 pF |
| 12 | 1 | 1 | 0 | 0 | 1.2 pF |
| 13 | 1 | 1 | 0 | 1 | 1.3 pF |
| 14 | 1 | 1 | 1 | 0 | 1.4 pF |
| 15 | 1 | 1 | 1 | 1 | 1.5 pF |

FIG.11

| THERMOMETER CODE | 0.2 pF | 0.2 pF | 0.2 pF | 0.2 pF | 0.2 pF | 0.2 pF | 0.2 pF | TOTAL CA-PACITANCE [pF] |
| --- | --- | --- | --- | --- | --- | --- | --- | --- |
| | DEC7 | DEC6 | DEC5 | DEC4 | DEC3 | DEC2 | DEC1 | |
| 0 | 0 | 0 | 0 | 0 | 0 | 0 | 0 | 0.0 pF |
| 1 | 0 | 0 | 0 | 0 | 0 | 0 | 1 | 0.2 pF |
| 2 | 0 | 0 | 0 | 0 | 0 | 1 | 1 | 0.4 pF |
| 3 | 0 | 0 | 0 | 0 | 1 | 1 | 1 | 0.6 pF |
| 4 | 0 | 0 | 0 | 1 | 1 | 1 | 1 | 0.8 pF |
| 5 | 0 | 0 | 1 | 1 | 1 | 1 | 1 | 1.0 pF |
| 6 | 0 | 1 | 1 | 1 | 1 | 1 | 1 | 1.2 pF |
| 7 | 1 | 1 | 1 | 1 | 1 | 1 | 1 | 1.4 pF |

SIGNAL PROCESSING CIRCUIT

TECHNICAL FIELD

The present invention relates to signal processing circuits.

BACKGROUND ART

Conventionally, a technique related to a switched capacitor circuit in which an analog differential signal is sampled by a capacitor and the sampled analog differential signal is amplified by an amplifier is devised (For example, see Patent Documents 1 and 2 below).

RELATED ART DOCUMENTS

Patent Documents

[Patent Document 1] Japanese Unexamined Patent Application Publication No. 2006-33304
[Patent Document 2] Japanese Unexamined Patent Application Publication No. 11-298328

SUMMARY OF THE INVENTION

Problems to be Solved by the Invention

However, in the related art, in order to output the analog signal at a doubled data rate, it is necessary to provide two amplifiers and alternately output the amplified analog signals from the two amplifiers. Therefore, in the related art, driving two amplifiers may increase power consumption.

Means for Solving the Problems

A signal processing circuit according to one embodiment includes a first sampling capacitor and a second sampling capacitor connected for an input signal path of an analog signal, and a signal processor that performs predetermined processing on the analog signal sampled by the first sampling capacitor and the analog signal sampled by the second sampling capacitor. The sampling of the analog signal transmitted to one capacitor of the first sampling capacitor and the second sampling capacitor and the predetermined processing performed by the signal processor on the analog signal sampled by another capacitor of the first sampling capacitor and the second sampling capacitor can be performed in parallel.

Effects of the Invention

According to the signal processing circuit according to one embodiment, the data rate of the analog signal can be increased while suppressing an increase in power consumption.

BRIEF DESCRIPTION OF THE DRAWINGS

FIG. 10 is a diagram illustrating an example of binary codes used in the DAC according to the third embodiment;
FIG. 11 is a diagram illustrating an example of thermometer codes used in the DAC according to the third embodiment.

EMBODIMENT FOR CARRYING OUT THE INVENTION

In the following, an embodiment will be described with reference to the drawings.

Figure 1:
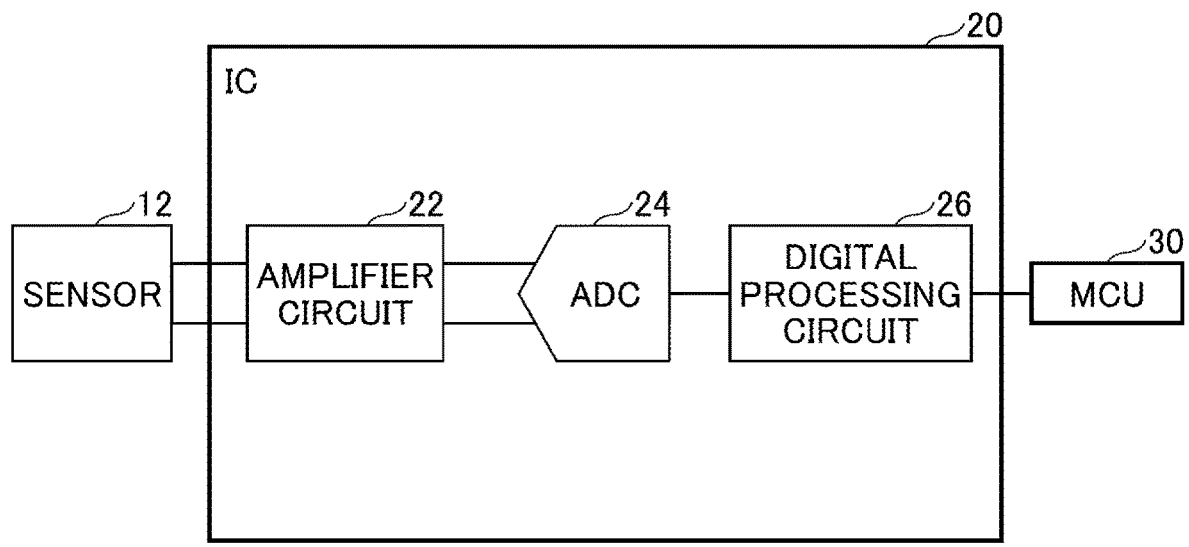
FIG. 1 is a diagram illustrating a configuration of a detecting system and an IC according to a first embodiment.

First Embodiment (Configuration of a Detecting System 10)
FIG. 1 is a diagram illustrating a configuration of a detecting system 10 and an IC 20 according to a first embodiment. The detecting system 10 illustrated in FIG. 1 includes a sensor 12, the integrated circuit (IC) 20, and a micro controller unit (MCU) 30.

The sensor 12 detects various detection targets (for example, the temperature, the strain, and the like). The sensor 12 is a differential sensor, and outputs two sensor signals (analog signals) representing a detection value with a difference.

The IC 20 is an integrated circuit that performs predetermined processing on the sensor signals (the analog signals) output from the sensor 12. For example, the IC 20 amplifies the sensor signals output from the sensor 12 and performs the A-D conversion on the sensor signals. Then, the IC 20 outputs the amplified and A-D converted sensor signal (a digital signal) to the MCU 30.

The MCU 30 acquires the amplified and A-D converted sensor signal (the digital signal) from the IC 20 through the communication with the IC 20. Then, the MCU 30 performs predetermined digital processing using the sensor signal acquired from the IC 20.
(Configuration of the IC 20)
As illustrated in FIG. 1, the IC 20 includes an amplifier circuit 22, an A-D converter 24, and a digital processing circuit 26.

The amplifier circuit 22 is an example of a "signal processing circuit". The amplifier circuit 22 is connected to the input terminals of the IC 20. The amplifier circuit 22 amplifies the sensor signals (the analog signals) input from the sensor 12 via the input terminals of the IC 20, and outputs the amplified signals to the A-D converter 24. Here, as will be described with reference to FIG. 2 and subsequent figures, the amplifier circuit 22 outputs the amplified sensor signals in each of the first period and the second period that alternately occur in the amplifier circuit 22, to output the amplified sensor signals having a data rate twice greater than the input sensor signals.

The A-D converter 24 is connected to the output terminals of the amplifier circuit 22. The A-D converter 24 converts the amplified sensor signals output from the amplifier circuit 22 from an analog signal to a digital signal, and outputs the digital signal to the digital processing circuit 26.

The digital processing circuit 26 is connected to the output terminal of the A-D converter 24. The digital processing circuit 26 performs predetermined digital signal processing (for example, digital filter processing) on the sensor signal (the digital signal) output from the A-D converter 24. Additionally, the digital processing circuit 26 transmits the sensor signal, on which the predetermined digital signal processing has been performed, to the MCU 30 through the communication with the MCU 30 (for example, the I2C communication).

(Circuit Configuration of the Amplifier Circuit 22)

Figure 2:
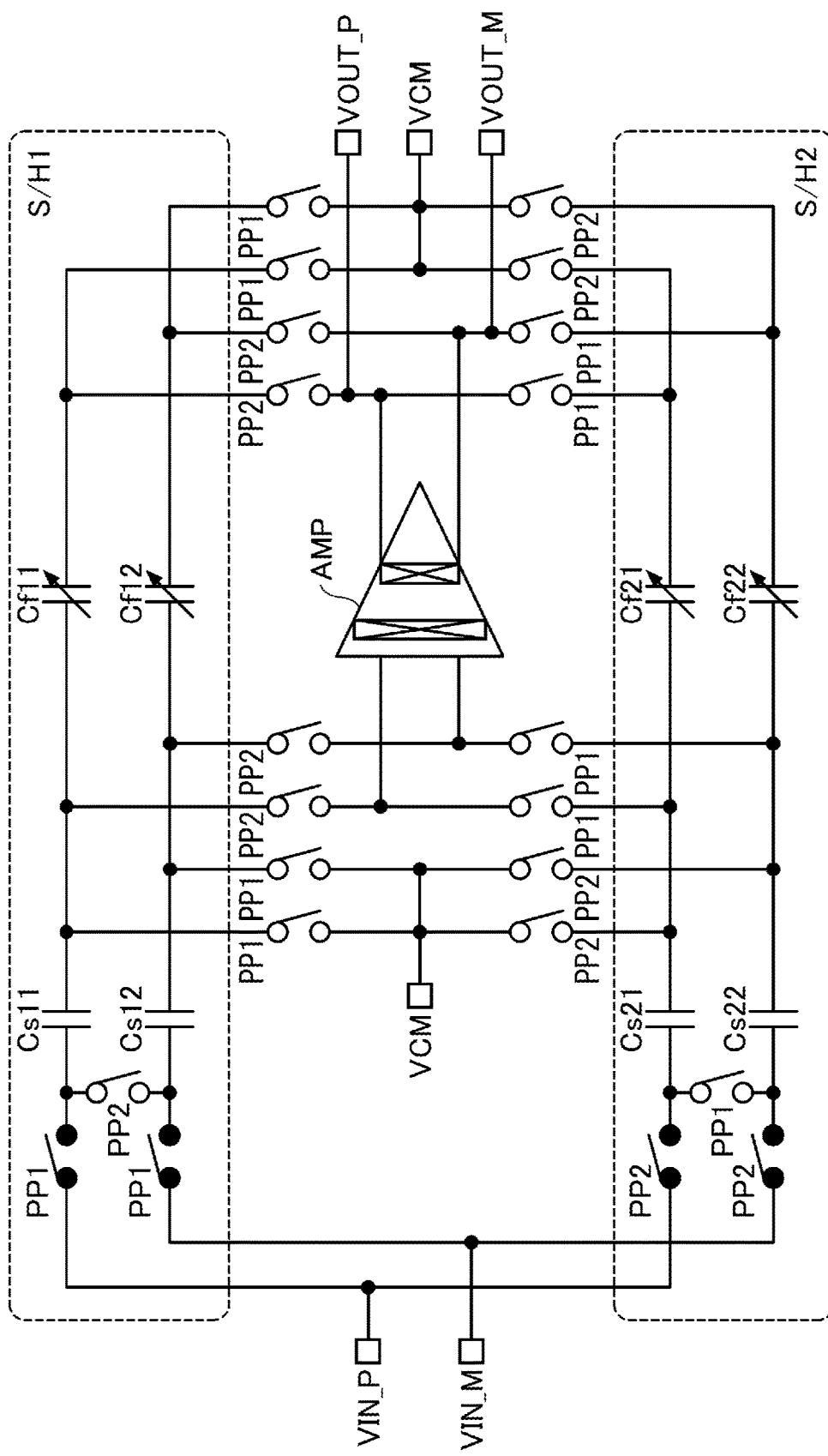
FIG. 2 is a diagram illustrating a circuit configuration of an amplifier circuit according to the first embodiment.

FIG. 2 is a diagram illustrating a circuit configuration of the amplifier circuit 22 according to the first embodiment. As illustrated in FIG. 2, the amplifier circuit 22 includes an input terminal VIN_P, an input terminal VIN_M, an amplifier AMP, an output terminal VOUT_P, an output terminal VOUT_M, a first processor S/H1, a second processor S/H2, multiple first switches PP1, and multiple second switches PP2.

Two analog signals (a non-inverted signal and an inverted signal) constituting a differential signal output from the sensor 12 are input to the input terminals VIN_P and VIN_M, respectively.

The amplifier AMP is an example of a "signal processor". In the second period, the amplifier AMP can amplify each of two analog signals sampled by sampling capacitors Cs11 and Cs12 of the first processor S/H1, which will be described later, with a predetermined gain, and output each of the two amplified analog signals.

Additionally, in the first period, the amplifier AMP can amplify each of the two analog signals sampled by sampling capacitors Cs21 and Cs22 of the second processor S/H2, which will be described later, with a predetermined gain, and output each of the two amplified analog signals.

The output terminals VOUT_P and VOUT_M respectively output, to the outside of the amplifier circuit 22, the two amplified analog signals (the non-inverted signal and the inverted signal) output from the amplifier AMP.

The first processor S/H1 includes the sampling capacitor Cs11 and a feedback capacitor Cf11 that are connected in series to each other, and the sampling capacitor Cs12 and a feedback capacitor Cf12 that are connected in series to each other.

In the first period, the sampling capacitor Cs11 is connected to the input terminal VIN_P via the first switch PP1, and the analog signal (the non-inverted signal) input from the input terminal VIN_P is sampled. In the first period, the sampling capacitor Cs12 is connected to the input terminal VIN_M via the first switch PP1, and the analog signal (the inverted signal) input from the input terminal VIN_M is sampled.

In the second period subsequent to the first period in which the analog signal (the non-inverted signal) is sampled, the analog signal (the non-inverted signal) sampled by the sampling capacitor Cs11 is amplified by the amplifier AMP by being transferred to the feedback capacitor Cf11, and is output from the output terminal VOUT_P.

In the second period subsequent to the first period in which the analog signal (the inverted signal) is sampled, the analog signal (the inverted signal) sampled by the sampling capacitor Cs12 is amplified by the amplifier AMP by being transferred to the feedback capacitor Cf12, and is output from the output terminal VOUT_M.

The second processor S/H2 includes the sampling capacitor Cs21 and a feedback capacitor Cf21 that are connected in series to each other, and the sampling capacitor Cs22 and a feedback capacitor Cf22 that are connected in series to each other.

In the second period, the sampling capacitor Cs21 is connected to the input terminal VIN_P via the second switch PP2, and the analog signal (the non-inverted signal) input from the input terminal VIN_P is sampled. In the second period, the sampling capacitor Cs22 is connected to the input terminal VIN_M via the second switch PP2, and the analog signal (the inverted signal) input from the input terminal VIN_M is sampled.

In the first period subsequent to the second period in which the analog signal (the non-inverted signal) is sampled, the analog signal (the non-inverted signal) sampled by the sampling capacitor Cs21 is amplified by the amplifier AMP by being transferred to the feedback capacitor Cf21, and is output from the output terminal VOUT_P.

In the first period subsequent to the second period in which the analog signal (the inverted signal) is sampled, the analog signal (the inverted signal) sampled by the sampling capacitor Cs22 is amplified by the amplifier AMP by being transferred to the feedback capacitor Cf22, and is output from the output terminal VOUT_M.

Here, in the amplifier circuit 22, the multiple first switches PP1 are switched to the ON state in the first period, and switched to the OFF state in the second period. Additionally, in the amplifier circuit 22, the multiple second switches PP2 are switched to the OFF state in the first period, and switched to the ON state in the second period.

Thus, in the amplifier circuit 22, in the first period, the analog signals input to the input terminals VIN_P and VIN_M are sampled by the sampling capacitors Cs11 and Cs12, and the analog signals sampled by the sampling capacitors Cs21 and Cs22 are amplified by the amplifier AMP and output from the terminals VOUT_P and VOUT_M.

Additionally, in the amplifier circuit 22, in the second period, the analog signals input to the input terminals VIN_P and VIN_M are sampled by the sampling capacitors Cs21 and Cs22, and the analog signals sampled by the sampling capacitors Cs11 and Cs12 are amplified by the amplifier AMP and output from the terminals VOUT_P and VOUT_M.

As a result, the amplifier circuit 22 can output the amplified analog signals in each of the first period and the second period which alternately occur, that is, the data rate of the analog signals can be doubled.

(Operation of the Amplifier Circuit 22)

Figure 3:
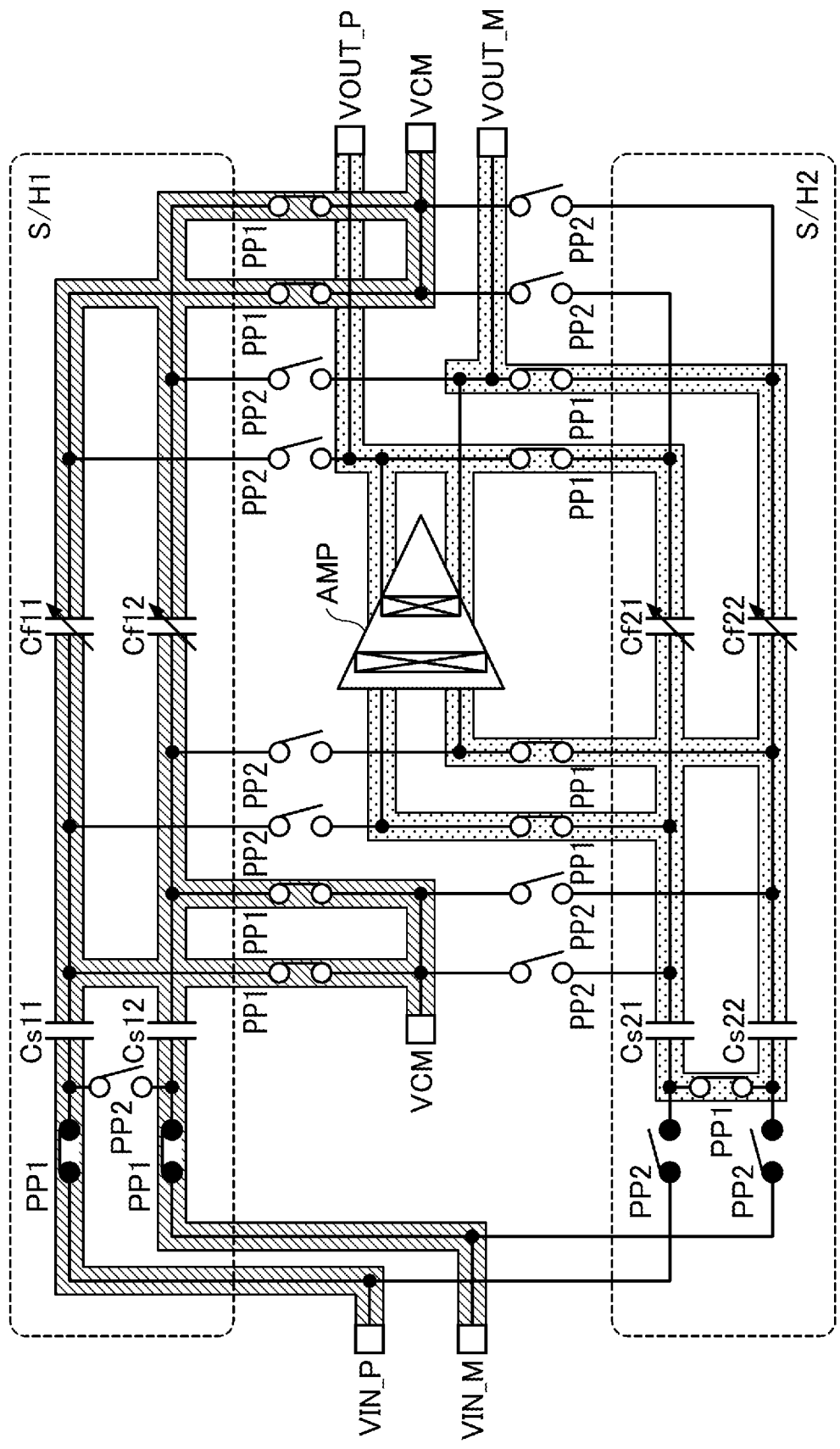
FIG. 3 is a diagram illustrating a state of the amplifier circuit according to the first embodiment in a first period.
Figure 4:
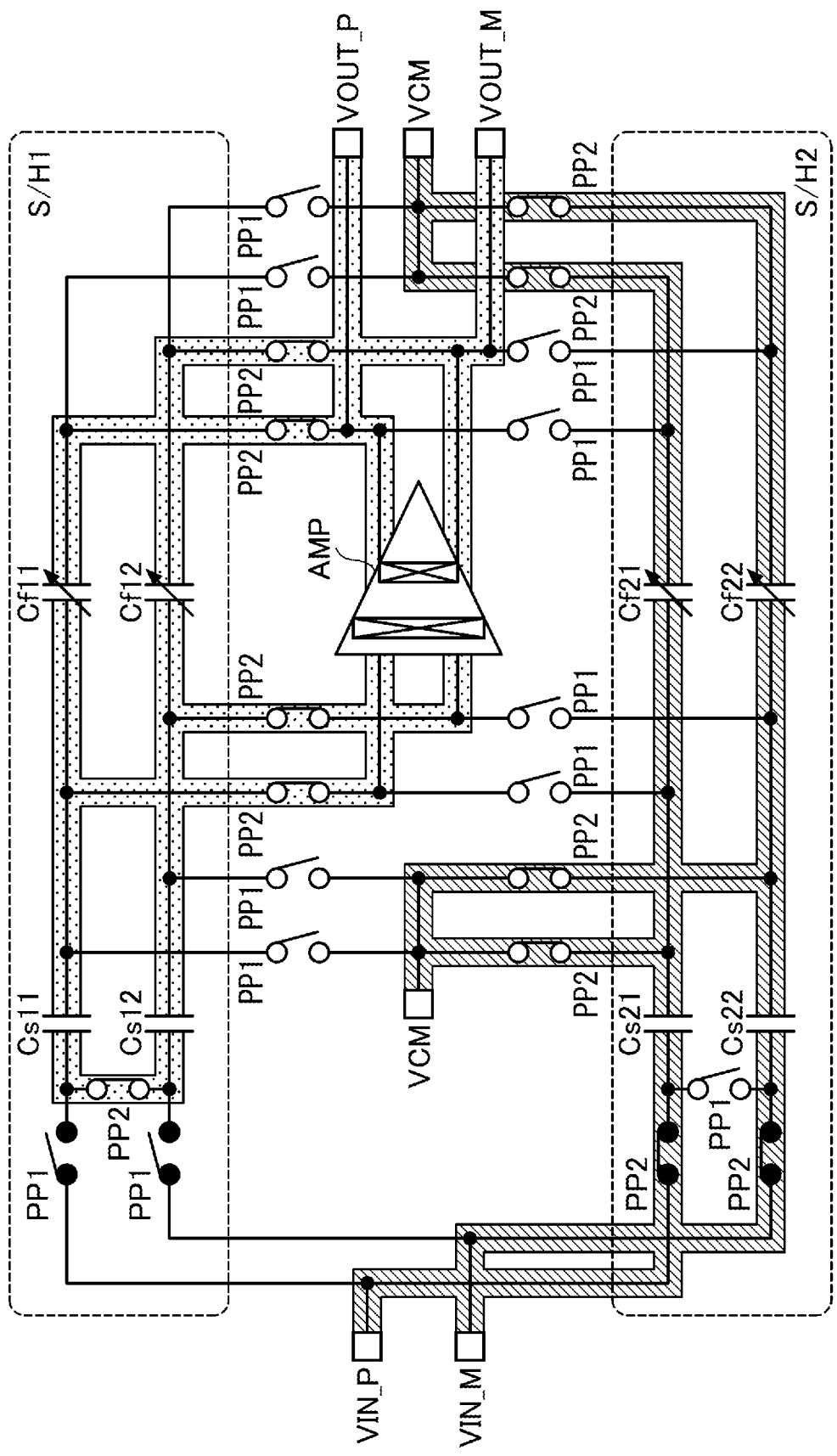
FIG. 4 is a diagram illustrating a state of the amplifier circuit according to the first embodiment in a second period.
Figure 5:
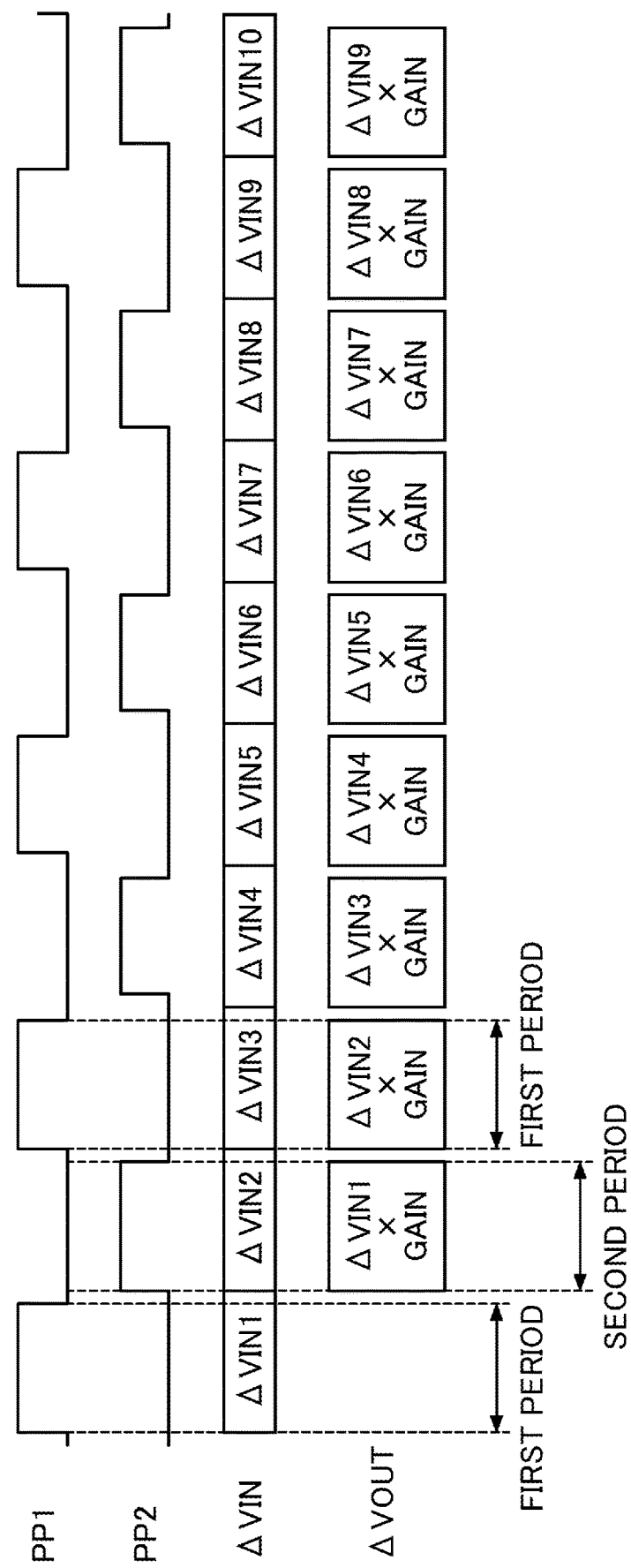
FIG. 5 is a timing chart indicating operation timings of the amplifier circuit according to the first embodiment.

Next, an operation of the amplifier circuit 22 according to the first embodiment will be described with reference to FIGS. 3 to 5. FIG. 3 is a diagram illustrating a state of the amplifier circuit 22 according to the first embodiment in the first period. FIG. 4 is a diagram illustrating a state of the amplifier circuit 22 according to the first embodiment in the second period. FIG. 5 is a timing chart indicating operation timings of the amplifier circuit 22 according to the first embodiment.

As illustrated in FIG. 5, in the amplifier circuit 22, the first period and the second period alternately occur.

As illustrated in FIG. 3 and FIG. 5, in the first period, all of the multiple first switches PP1 are turned on, and all of the multiple second switches PP2 are turned off.

This allows, in the first period, the sampling capacitors Cs11 and Cs12 to be connected to the input terminals VIN_P and VIN_M, and the analog signals input from the input terminals VIN_P and VIN_M are sampled by the sampling capacitors Cs11 and Cs12.

At the same time, in the first period, the sampling capacitors Cs21 and Cs22 are short-circuited to each other, and the analog signals sampled by the sampling capacitors Cs21 and Cs22 are amplified by the amplifier AMP by being transferred to the feedback capacitors Cf21 and Cf22, and are output from the terminals VOUT_P and VOUT_M.

Conversely, as illustrated in FIG. 4 and FIG. 5, in the second period, all of the multiple first switches PP1 are turned off, and all of the multiple second switches PP2 are turned on.

This allows, in the second period, the sampling capacitors Cs21 and Cs22 to be connected to the input terminals VIN_P and VIN_M, and the analog signals input from the input terminals VIN_P and VIN_M are sampled by the sampling capacitors Cs21 and Cs22.

At the same time, in the second period, the sampling capacitors Cs11 and Cs12 are short-circuited to each other, and the analog signals sampled by the sampling capacitors Cs11 and Cs12 are amplified by the amplifier AMP by being transferred to the feedback capacitors Cf11 and Cf12, and are output from the terminals VOUT_P and VOUT_M.

As a result, the amplifier circuit 22 can output the amplified analog signals in each of the first period and the second period that alternately occur, that is, the data rate of the analog signal can be doubled.

For example, the example illustrated in FIG. 5 indicates that, in the initial first period, an analog signal $\Delta VIN1$ input from an input terminal $\Delta VIN$ is sampled by the sampling capacitors Cs11 and Cs12.

Additionally, the example illustrated in FIG. 5 indicates that, in the next second period, an analog signal $\Delta VIN2$ input from the input terminal $\Delta VIN$ is sampled by the sampling capacitors Cs21 and Cs22, and the analog signal $\Delta VIN1$ sampled by the sampling capacitors Cs11 and Cs12 is amplified and output from an output terminal $\Delta VOUT$.

Furthermore, the example illustrated in FIG. 5 indicates that, in the next first period, an analog signal $\Delta VIN3$ input from the input terminal $\Delta VIN$ is sampled by the sampling capacitors Cs11 and Cs12, and the analog signal $\Delta VIN2$ sampled by the sampling capacitors Cs21 and Cs22 is amplified and output from the output terminal $\Delta VOUT$.

Here, in FIG. 5, the input terminal $\Delta VIN$ represents a difference between the input terminal VIN_P and the input terminal VIN_M. The output terminal $\Delta VOUT$ represents a difference between the output terminal VOUT_P and the output terminal VOUT_M. The analog signal $\Delta VIN$ represents a difference between the analog signal (the non-inverted signal) and the analog signal (the inverted signal) constituting the differential signal.

Additionally, as illustrated in FIG. 5, a non-overlap period, in which PP1 and PP2 are not simultaneously turned on, is provided between the transition from the first period to the second period.

As described above, the amplifier circuit 22 according to the first embodiment includes the first sampling capacitors Cs11 and Cs12 and the second sampling capacitors Cs21 and Cs22 that are connected for the input signal path of the analog signals, and the amplifier AMP that performs amplification processing on the analog signals sampled by the first sampling capacitors Cs11 and Cs12 and the analog signals sampled by the second sampling capacitors Cs21 and Cs22, and sampling, of the analog signals transmitted to one of capacitors of the first sampling capacitors Cs11 and Cs12 and capacitors of the second sampling capacitors Cs21 and Cs22; and amplification processing, performed by the amplifier AMP on the analog signals sampled by the other of the capacitors of the first sampling capacitors Cs11 and Cs12 and the capacitors of the second sampling capacitors Cs21 and Cs22, can be performed in parallel.

Thus, the amplifier circuit 22 according to the first embodiment can output the analog signals amplified by one amplifier AMP in each of the first period and the second period by alternately providing the second period in which the analog signals sampled by the first sampling capacitors Cs11 and Cs12 are output and the first period in which the analog signals sampled by the second sampling capacitors Cs21 and Cs22 are output. Therefore, according to the amplifier circuit 22 of the first embodiment, two amplifiers that are required to be used in a normal form can be replaced with one amplifier, and the data rate of the analog signals can be doubled while suppressing an increase in power consumption.

Additionally, in the amplifier circuit 22 according to the first embodiment, the first period and the second period alternately occur. In the first period, the analog signals are sampled by the first sampling capacitors Cs11 and Cs12 and the amplifier AMP performs the amplification processing on the analog signals sampled by the second sampling capacitors Cs21 and Cs22. In the second period, the analog signals are sampled by the second sampling capacitors Cs21 and Cs22 and the amplifier AMP performs the amplification processing on the analog signals sampled by the first sampling capacitors Cs11 and Cs12.

Thus, the amplifier circuit 22 according to the first embodiment can output the analog signals amplified by one amplifier AMP in each of the first period and the second period. Therefore, the amplifier circuit 22 according to the first embodiment can double the data rate of the analog signals while suppressing an increase in power consumption.

Additionally, in the amplifier circuit 22 according to the first embodiment, in the first period, by turning on the multiple first switches PP1, the input signal path of the analog signals is connected to the first sampling capacitors Cs11 and Cs12, and the second sampling capacitors Cs21 and Cs22 are connected to the amplifier AMP, and in the second period, by turning on the multiple second switches PP2, the input signal path of the analog signals is connected to the second sampling capacitors Cs21 and Cs22, and the first sampling capacitors Cs11 and Cs12 are connected to the amplifier AMP.

Thus, the amplifier circuit 22 according to the first embodiment can alternately switch between the operation in the first period and the operation in the second period by a simple control of alternately switching on the multiple first switches PP1 and the multiple second switches PP2.

Second Embodiment

Next, a second embodiment will be described with reference to FIG. 6 and FIG. 7. In the second embodiment, an example in which the configuration for doubling the data rate of the analog signals described in the first embodiment is applied to an averaging filter circuit 40 will be described.

(Circuit Configuration of the Averaging Filter Circuit 40)

Figure 6:
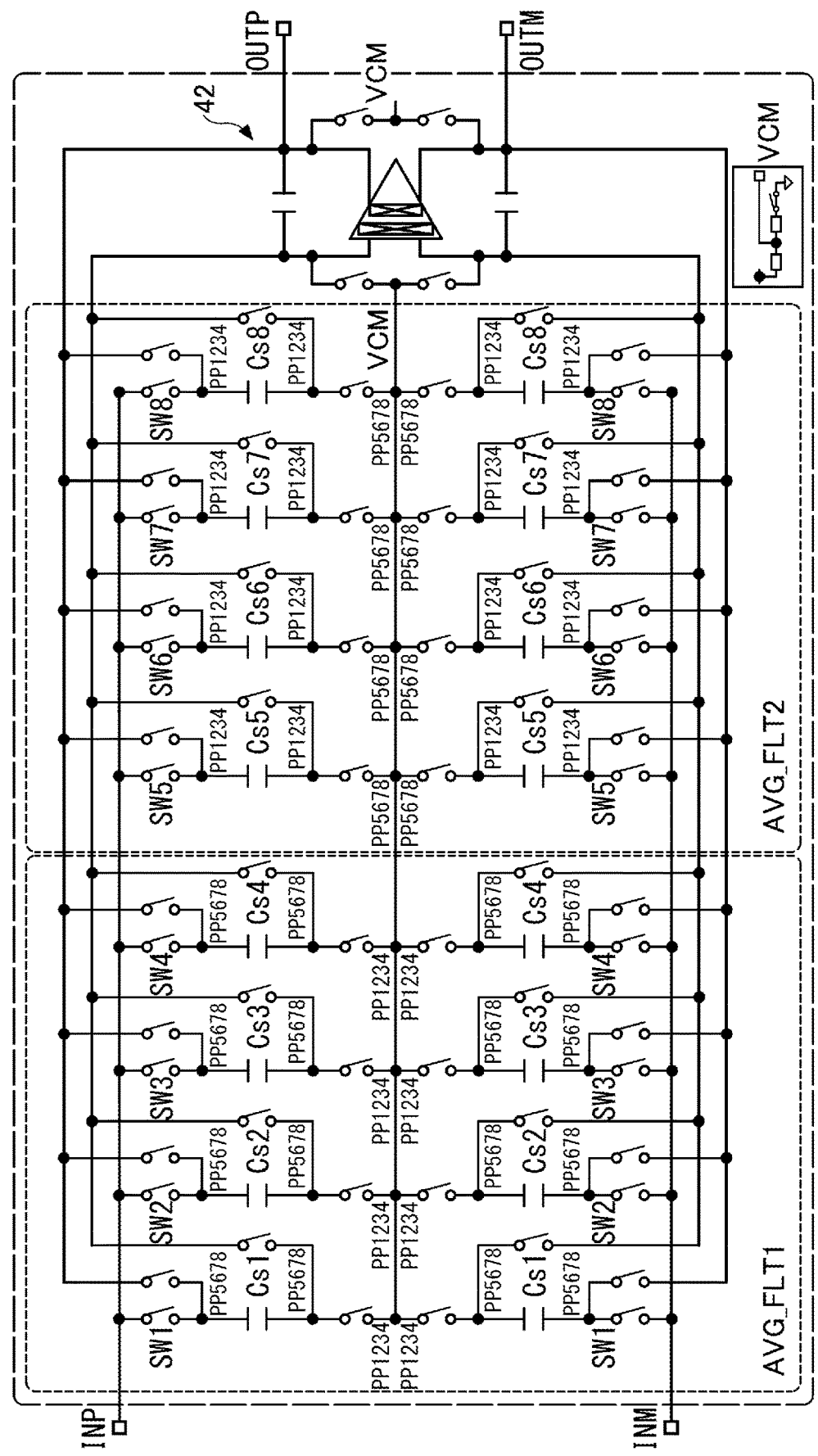
FIG. 6 is a diagram illustrating a circuit configuration of an averaging filter circuit according to a second embodiment.

FIG. 6 is a diagram illustrating a circuit configuration of the averaging filter circuit 40 according to the second embodiment. As illustrated in FIG. 6, the averaging filter circuit 40 (another example of the "signal processing circuit") includes an input terminal INP, an input terminal INM, a first processor AVG_FLT1, a second processor AVG_FLT2, an averaging filter 42, and an output terminal OUTP, and an output terminal OUTM.

Two analog signals (a non-inverted signal and an inverted signal) constituting a differential signal are respectively input to the input terminals INP and INM.

The averaging filter 42 is another example of the "signal processor", and can output an analog signal (a non-inverted signal) representing an average value of four analog signals (non-inverted signals) sampled by first sampling capacitors Cs1 to Cs4 provided on the +side of the first processor AVG_FLT1 described later, and can output an analog signal (an inverted signal) representing an average value of four analog signals (inverted signals) sampled by the first sampling capacitors Cs1 to Cs4 provided on the −side of the first processor AVG_FLT1 described later.

Additionally, the averaging filter 42 can output an analog signal (a non-inverted signal) representing an average value of four analog signals (non-inverted signals) sampled by second sampling capacitors Cs5 to Cs8 provided on the +side of the second processor AVG_FLT2 described later, and can output an analog signal (an inverted signal) representing an average value of four analog signals (inverted signals) sampled by second sampling capacitors Cs5 to Cs8 provided on the −side of the second processor AVG_FLT2 described later.

The output terminals OUTP and OUTM output, to the outside of the averaging filter circuit 40, the two respective analog signals (the non-inverted signal and the inverted signal) output from the averaging filter 42, to which the averaging filter has been applied.

The first processor AVG_FLT1 includes the four first sampling capacitors Cs1 to Cs4 that are all connected between the input terminal INP and a common voltage VCM (referred to as "the first sampling capacitors Cs1 to Cs4 on the +side"). Additionally, the first processor AVG_FLT1 includes the four first sampling capacitors Cs1 to Cs4 that are all connected between the input terminal INM and the common voltage VCM (referred to as the "first sampling capacitors Cs1 to Cs4 on the −side").

Respective switches SW1 to SW4 are provided between the first sampling capacitors Cs1 to Cs4 on the +side and the input terminal INP. Additionally, respective switches SW1 to SW4 are provided between the first sampling capacitors Cs1 to Cs4 on the −side and the input terminal INM.

The first sampling capacitors Cs1 to Cs4 on the +side are sequentially connected to the input terminal INP via the switches SW1 to SW4 in the first period, and an analog signal (a non-inverted signals) input from the input terminal INP is sampled. The first sampling capacitors Cs1 to Cs4 on the −side are sequentially connected to the input terminal INM via the switches SW1 to SW4 in the first period, and an analog signal (an inverted signal) input from the input terminal INM is sampled.

The four analog signals (the non-inverted signals) sampled by the first sampling capacitors Cs1 to Cs4 on the +side are transferred to the averaging filter 42 via second switches PP5678 in the second period subsequent to the first period, in which the analog signal (the non-inverted signal) is sampled, and are averaged by the averaging filter 42. As a result, the analog signal (the non-inverted signal) representing the average value of the four analog signals (the non-inverted signals) is output from the output terminal OUTP.

The four analog signals (the inverted signals) sampled by the first sampling capacitors Cs1 to Cs4 on the −side are transferred to the averaging filter 42 via second switches PP5678 in the second period subsequent to the first period in which the analog signal (the inverted signal) is sampled, and are averaged by the averaging filter 42. As a result, the analog signal (the inverted signal) representing the average value of the four analog signals (the inverted signals) is output from the output terminal OUTM.

The second processor AVG_FLT2 includes four second sampling capacitors Cs5 to Cs8 that are connected between the input terminal INP and the common voltage VCM (referred to as the "second sampling capacitors Cs5 to Cs8 on the +side"). Additionally, the second processor AVG_FLT2 includes four second sampling capacitors Cs5 to Cs8 that are all connected between the input terminal INM and the common voltage VCM (referred to as the "second sampling capacitors Cs5 to Cs8 on −side").

Respective switches SW5 to SW8 are provided between the second sampling capacitors Cs5 to Cs8 on the +side and the input terminal INP. Additionally, respective switches SW5 to SW8 are provided between the second sampling capacitors Cs5 to Cs8 on the −side and the input terminal INM.

The second sampling capacitors Cs5 to Cs8 on the +side are sequentially connected to the input terminal INP via the switches SW5 to SW8 in the second period, and the analog signal (the non-inverted signal) input from the input terminal INP is sampled. The second sampling capacitors Cs5 to Cs8 on the −side are sequentially connected to the input terminal INM via the switches SW5 to SW8 in the second period, and the analog signal (the inverted signal) input from the input terminal INM is sampled.

The four analog signals (the non-inverted signals) sampled by the second sampling capacitors Cs5 to Cs8 on the +side are transferred to the averaging filter 42 via the first switches PP1234 in the first period subsequent to the second period in which the analog signal (the non-inverted signal) is sampled, and are averaged by the averaging filter 42. As a result, the analog signal (the non-inverted signal) representing the average value of the four analog signals (the non-inverted signals) is output from the output terminal OUTP.

The four analog signals (the inverted signals) sampled by the second sampling capacitors Cs5 to Cs8 on the −side are transferred to the averaging filter 42 via the first switches PP1234 in the first period next to the second period in which the analog signal (the inverted signal) is sampled, and are averaged by the averaging filter 42. As a result, the analog signal (the inverted signal) representing the average value of the four analog signals (the inverted signals) is output from the output terminal OUTM.

Here, in the averaging filter circuit 40, the multiple first switches PP1234 are switched to the ON state in the first period, and are switched to the OFF state in the second period. Additionally, in the averaging filter circuit 40, the multiple second switches PP5678 are switched to the OFF state in the first period, and are switched to the ON state in the second period.

Thus, in the averaging filter circuit 40, in the first period, the analog signal (the non-inverted signal) input to the input terminal INP is sequentially sampled by the first sampling capacitors Cs1 to Cs4 on the +side, and the analog signal (the inverted signal) input to the input terminals INM is sequentially sampled by the first sampling capacitors Cs1 to Cs4 on the −side. At the same time, the four analog signals (the non-inverted signals) respectively sampled by the second sampling capacitors Cs5 to Cs8 on the +side are averaged by the averaging filter 42 and the analog signal (the non-inverted signal) representing the average value of the four analog signals is output from the output terminal OUTP. Additionally, at the same time, the four analog signals (the inverted signals) respectively sampled by the second sampling capacitors Cs5 to Cs8 on the −side are averaged by the averaging filter 42, and the analog signal (the inverted signal) representing the average value of the four analog signals is output from the output terminal OUTM.

Additionally, in the averaging filter circuit 40, in the second period, the analog signal (the non-inverted signal) input to the input terminal INP is sequentially sampled by the second sampling capacitors Cs5 to Cs8 on the +side, and the analog signal (the inverted signal) input to the input terminal INM is sequentially sampled by the second sampling capacitors Cs5 to Cs8 on the −side. At the same time, the four analog signals (the non-inverted signals) respectively sampled by the first sampling capacitors Cs1 to Cs4 on the +side are averaged by the averaging filter 42 and the analog signal (the non-inverted signal) representing the average value of the four analog signals is output from the output terminal OUTP. Additionally, at the same time, the four analog signals (the inverted signals) respectively sampled by the first sampling capacitors Cs1 to Cs4 on the −side are averaged by the averaging filter 42, and the analog signal (the inverted signal) representing the average value of the four analog signals is output from the output terminal OUTM.

As a result, the averaging filter circuit 40 can output, in each of the first period and the second period which alternately occur, the analog signals (the non-inverted signal and the inverted signal) to which the averaging filter has been applied, that is, can double the data rate of the analog signals.

Figure 7:
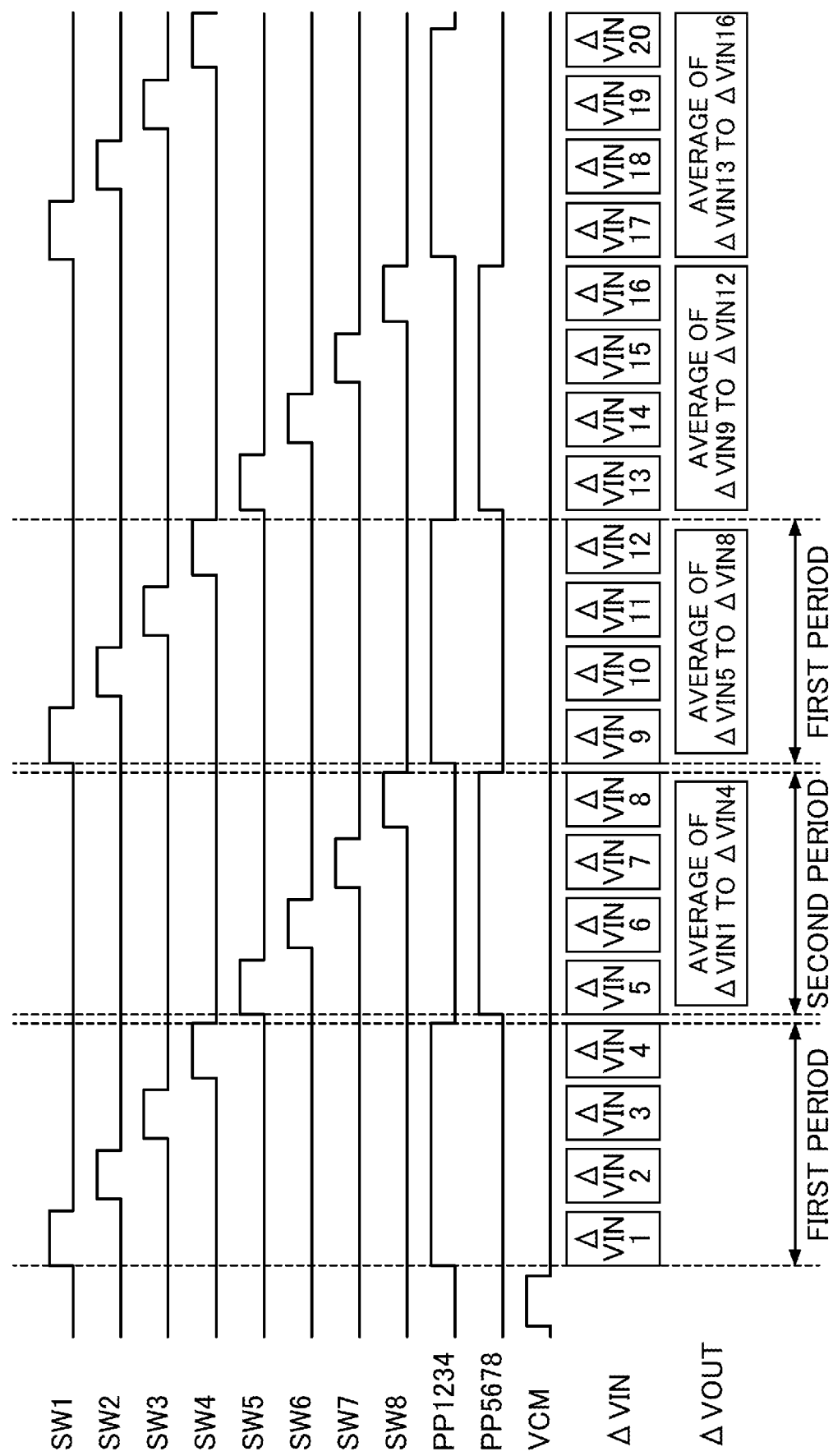
FIG. 7 is a timing chart indicating operation timings of the averaging filter circuit according to the second embodiment.

Here, as illustrated in FIG. 7, a non-overlap period, in which PP1234 and PP5678 are not simultaneously turned on, is provided between the transition from the first period to the second period.

(Operation of the Averaging Filter Circuit 40)

FIG. 7 is a timing chart indicating operation timings of the averaging filter circuit 40 according to the second embodiment.

As illustrated in FIG. 7, the first period and the second period alternately occur in the averaging filter circuit 40.

As illustrated in FIG. 7, in the first period, all of the multiple first switches PP1234 are turned on, and all of the multiple second switches PP5678 are turned off. Additionally, as illustrated in FIG. 7, in the first period, the switches SW1 to SW4 are sequentially turned on.

Thus, in the first period, the first sampling capacitors Cs1 to Cs4 on the +side are sequentially connected to the input terminal INP, and the analog signal (the non-inverted signal) input from the input terminal INP is sampled by each of the first sampling capacitors Cs1 to Cs4 on the +side. Additionally, the first sampling capacitors Cs1 to Cs4 on the −side are sequentially connected to the input terminal INM, and the analog signal (the inverted signal) input from the input terminal INM is sampled by each of the first sampling capacitors Cs1 to Cs4 on the −side.

At the same time, in the first period, the four analog signals (the non-inverted signals) sampled by the second sampling capacitors Cs5 to Cs8 on the +side are averaged by the averaging filter 42 by being transferred to the averaging filter 42. As a result, the analog signal (the non-inverted signal) representing an average value of the four analog signals (the non-inverted signals) is output from the output terminal OUTP.

Additionally, at the same time, in the first sampled by the second sampling capacitors Cs5 to Cs8 on the −side are averaged by the averaging filter 42 by being transferred to the averaging filter 42. As a result, the analog signal (the inverted signal) representing the average value of the four analog signals (the inverted signals) is output from the output terminal OUTM.

Conversely, as illustrated in FIG. 7, in the second period, all of the multiple first switches PP1234 are turned off, and all of the multiple second switches PP5678 are turned on. Additionally, as illustrated in FIG. 7, in the second period, the switches SW5 to SW8 are sequentially turned ON.

Thus, in the second period, the second sampling capacitors Cs5 to Cs8 on the +side are sequentially connected to the input terminal INP, and the analog signal (the non-inverted signal) input from the input terminal INP is sampled by each of the second sampling capacitors Cs5 to Cs8 on the +side. Additionally, the second sampling capacitors Cs5 to Cs8 on the −side are sequentially connected to the input terminal INM, and the analog signal (the inverted signal) input from the input terminal INM is sampled by each of the second sampling capacitors Cs5 to Cs8 on the −side.

At the same time, in the second period, the four analog signals (non-inverted signals) sampled by the first sampling capacitors Cs1 to Cs4 on the +side are averaged by the averaging filter 42 by being transferred to the averaging filter 42. As a result, the analog signal (the non-inverted signal) representing the average value of the four analog signals (the non-inverted signals) is output from the output terminal OUTP.

Additionally, at the same time, in the second sampled by the first sampling capacitors Cs1 to Cs4 on the −side are averaged by the averaging filter 42 by being transferred to the averaging filter 42. As a result, the analog signal (the inverted signal) representing the average value of the four analog signals (the inverted signals) is output from the output terminal OUTM.

As a result, the averaging filter circuit 40 can output the analog signals to which the averaging filter has been applied in each of the first period and the second period which alternately occur, that is, can double the data rate of the analog signals.

For example, the example illustrated in FIG. 5 indicates that the analog signals ΔVIN1 to ΔVIN4 input from the input terminal ΔVIN are sequentially sampled by the first sampling capacitors Cs1 to Cs4 in the first period, respectively.

Additionally, in the example illustrated in FIG. 5, in the next second period, the analog signals ΔVIN5 to ΔVIN8 input from the input terminal ΔVIN are sequentially sampled by the second sampling capacitors Cs5 to Cs8, respectively, and the analog signal representing the average value of the analog signals ΔVIN1 to ΔVIN4 respectively sampled by the first sampling capacitors Cs1 to Cs4 is output from the output terminal ΔVOUT.

Further, the example illustrated in FIG. 5 indicates that, in the next first period, the analog signals ΔVIN9 to ΔVIN12 input from the input terminal ΔVIN are sequentially sampled by the first sampling capacitors Cs1 to Cs4, respectively, and the analog signal representing the average value of the analog signals ΔVIN5 to ΔVIN8 respectively sampled by the second sampling capacitors Cs5 to Cs8 is output from the output terminal ΔVOUT.

Here, in FIG. 7, the input terminal ΔVIN represents a difference between the input terminal INP and the input terminal INM. Additionally, the output terminal ΔVOUT represents a difference between the output terminal OUTP and the output terminal OUTM. The analog signal ΔVIN represents a difference between the analog signal (the non-inverted signal) and the analog signal (the inverted signal) constituting the differential signal.

As described above, the averaging filter circuit 40 according to the second embodiment includes the first sampling capacitors Cs1 to Cs4 and the second sampling capacitors Cs5 to Cs8 connected for the input signal path of the analog signal, and the averaging filter 42 that performs averaging filter processing on the analog signals sampled by the first sampling capacitors Cs1 to Cs4 and the analog signals sampled by the second sampling capacitors Cs5 to Cs8, and the sampling of the analog signals with respect to one of capacitors of the first sampling capacitors Cs1 to Cs4 and capacitors of the second sampling capacitors Cs5 to Cs8; and the averaging filter processing, performed by the averaging filter 42 on the analog signals sampled by the other of the capacitors of the first sampling capacitors Cs1 to Cs4 and the capacitors of the second sampling capacitors Cs5 to Cs8, can be performed in parallel.

Thus, the averaging filter circuit 40 according to the second embodiment can output the analog signals on which the averaging filter processing has been performed by one averaging filter 42 in each of the first period and the second period by alternately providing the second period in which the analog signals sampled by the first sampling capacitors Cs1 to Cs4 are output and the first period in which the analog signals sampled by the second sampling capacitors Cs5 to Cs8 are output. Therefore, the averaging filter circuit 40 according to the second embodiment can double the data rate of the analog signals while suppressing an increase in power consumption.

Additionally, in the averaging filter circuit 40 according to the second embodiment, the first period and the second period alternately occur. In the first period, the analog signals are sampled by the first sampling capacitors Cs1 to Cs4, and the averaging filter 42 performs the averaging filter processing on the analog signals sampled by the second sampling capacitors Cs5 to Cs8. In the second period, the analog signals are sampled by the second sampling capacitors Cs5 to Cs8, and the averaging filter 42 performs the averaging filter processing on the analog signals sampled by the first sampling capacitors Cs1 to Cs4.

Thus, the averaging filter circuit 40 according to the second embodiment can output the analog signals on which the averaging filter processing has been performed by one averaging filter 42 in each of the first period and the second period. Therefore, the averaging filter circuit 40 according to the second embodiment can double the data rate of the analog signals while suppressing an increase in power consumption.

Additionally, in the averaging filter circuit 40 according to the second embodiment, the input signal path of the analog signal is connected to the first sampling capacitors Cs1 to Cs4 and the second sampling capacitors Cs5 to Cs8 are connected to the averaging filter 42 by turning on the multiple first switches PP1234 in the first period, and the input signal path of the analog signal is connected to the second sampling capacitors Cs5 to Cs8 and the first sampling capacitors Cs1 to Cs4 are connected to the averaging filter 42 by turning on the multiple second switches PP5678 in the second period.

Thus, the averaging filter circuit 40 according to the second embodiment can alternately switch between the operation in the first period and the operation in the second period by a simple control such as alternately turning on the multiple first switches PP1234 and turning on the multiple second switches PP5678.

Third Embodiment

Next, a third embodiment will be described with reference to FIG. 8 and FIG. 9. In the third embodiment, an amplifier circuit 22A having an offset adjustment function will be described as a modified example of the amplifier circuit 22 described in the first embodiment.

(Circuit Configuration of the Amplifier Circuit 22A)

Figure 8:
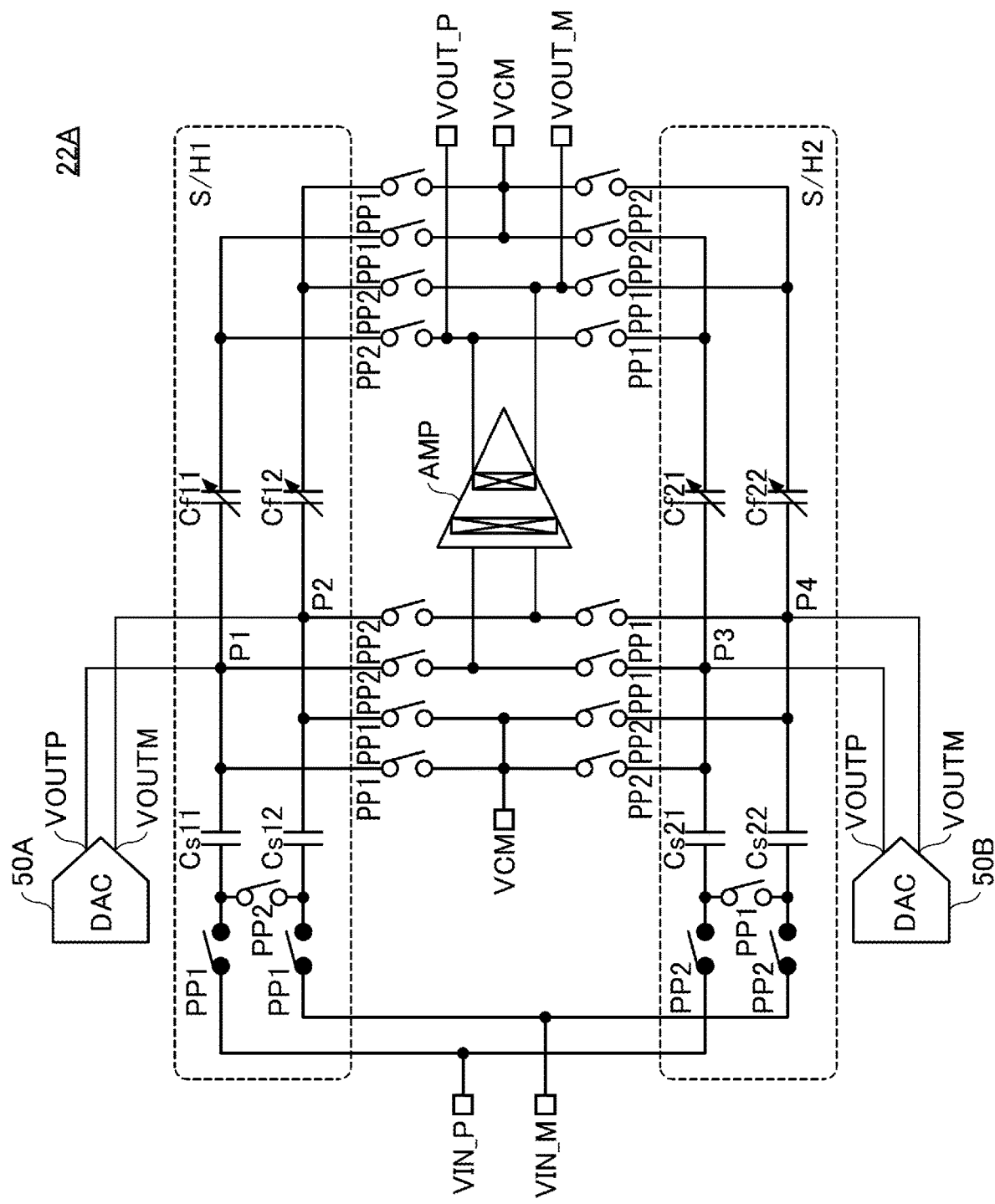
FIG. 8 is a diagram illustrating a circuit configuration of an amplifier circuit according to a third embodiment.

FIG. 8 is a diagram illustrating a circuit configuration of the amplifier circuit 22A according to the third embodiment. As illustrated in FIG. 2, the amplifier circuit 22A is different from the amplifier circuit 22 described in the first embodiment in that the amplifier circuit 22A further includes two digital-to-analog converters (DACs) 50.

Each of the two D-A converters 50 has the same circuit configuration. Each of the two D-A converters 50 is a capacitive D-A converter including multiple capacitors, and functions as an "offset adjustment circuit".

In one D-A converter 50 among the two D-A converters 50 (hereinafter, referred to as a "D-A converter 50A"), an output terminal VOUTP is connected to a connection point P1 between the sampling capacitor Cs11 and the feedback capacitor Cf11 that are provided in the first processor S/H1, and an output terminal VOUTM is connected to a connection point P2 between the sampling capacitor Cs12 and the feedback capacitor Cf12 that are provided in the first processor S/H1. This enables the D-A converter 50A to perform the offset adjustment on each of the two analog signals (the non-inverted signal and the inverted signal) transferred to the feedback capacitors Cf11 and Cf12.

In the other D-A converter 50 among the two D-A converters 50 (hereinafter, referred to as a "D-A converter 50B"), an output terminal VOUTP is connected to a connection point P3 between the sampling capacitor Cs21 and the feedback capacitor Cf21 that are provided in the second processor S/H2, and an output terminal VOUTM is connected to a connection point P4 between the sampling capacitor Cs22 and the feedback capacitor Cf22 provided in the second processor S/H2. This enables the D-A converter 50B to perform the offset adjustment on each of the two analog signals (the non-inverted signal and the inverted signal) transferred to the feedback capacitors Cf21 and Cf22.

Here, the "offset adjustment" is to reduce the offset amount of the voltage of the sensor signal to be amplified by the amplifier AMP (preferably to 0). By performing the "offset adjustment", the voltage of the sensor signal output from the amplifier AMP can be prevented from exceeding a predetermined upper limit threshold and lower limit threshold even when the sensor signal is amplified with a high gain by the amplifier AMP.

(Circuit Configuration of the D-A Converter 50)

Figure 9:
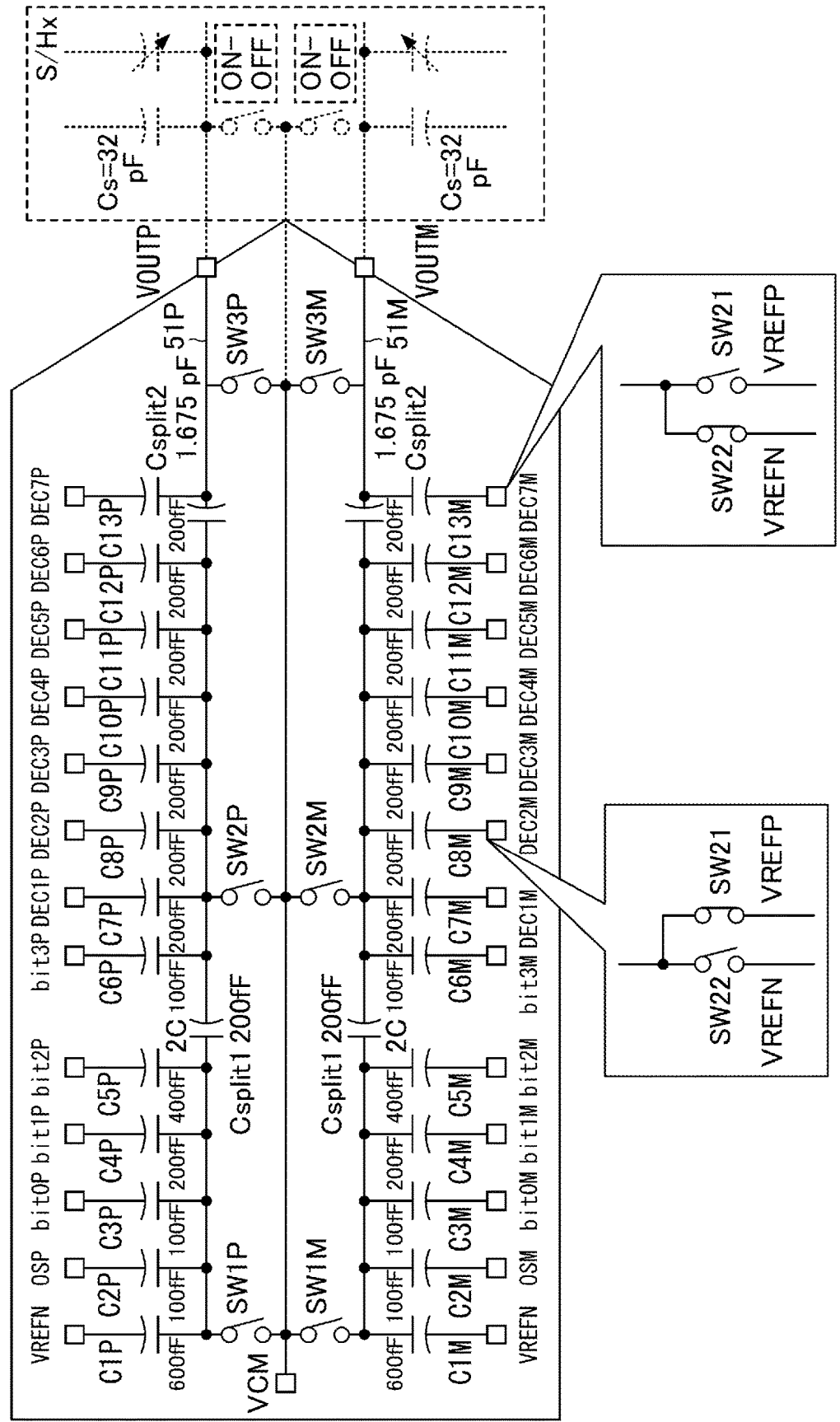
FIG. 9 is a diagram illustrating a circuit configuration of a DAC according to the third embodiment.

FIG. 9 is a diagram illustrating a circuit configuration of the D-A converter 50 according to the third embodiment.

As illustrated in FIG. 9, the D-A converter 50 includes a signal line 51P connected to the VOUTP and a signal line 51M connected to the VOUTM.

In the D-A converter 50, five capacitors C1P, C2P, C3P, C4P, and C5P are connected to the signal line 51P. The five capacitors C1P, C2P, C3P, C4P, and C5P are respectively connected to connecting portions VREFN, OSP, bit0P, bit1P, and bit2P. A switch SW1P can connect the five capacitors C1P, C2P, C3P, C4P, and C5P to a common voltage VCM.

Additionally, eight capacitors C6P, C7P, C8P, C9P, C10P, C11P, C12P, and C13P are connected to the signal line 51P. The eight capacitors C6P, C7P, C8P, C9P, C10P, C11P, C12P, and C13P are respectively connected to connecting portions bit3P, DEC1P, DEC2P, DEC3P, DEC4P, DEC5P, DEC6P, and DEC7P. A switch SW2P can connect the eight capacitors C6P, C7P, C8P, C9P, C10P, C11P, C12P, and C13P to the common voltage VCM.

A switch SW3P is connected to the VOUTP and is connectable to the common voltage VCM.

In the signal line 51P, capacitors Csplit2 are provided between the capacitors C1P to C13P and the VOUTP. This weights the D-A converter 50 with respect to the capacitors C1P to C13P with the capacitors Csplit2.

Additionally, in the signal line 51P, a capacitor Csplit1 is provided between the capacitors C1P to C5P and the capacitors C6P to C13P. Thus, this further weights the D-A converter 50 with respect to the capacitors C1P to C5P with the capacitor Csplit1.

In the D-A converter 50, five capacitors C1M, C2M, C3M, C4M, and C5M are connected to the signal line 51M. The five capacitors C1M, C2M, C3M, C4M, and C5M are respectively connected to the connecting portions VREFN, OSM, bit0M, bit1M, and bit2M. A switch SW1M can connect the five capacitors C1M, C2M, C3M, C4M, and C5M to the common voltage VCM.

Additionally, eight capacitors C6M, C7M, C8M, C9M, C10M, C11M, C12M, and C13M are connected to the signal line 51M. The eight capacitors C6M, C7M, C8M, C9M, C10M, C11M, C12M, and C13M are respectively connected to connecting portions bit3M, DEC1M, DEC2M, DEC3M, DEC4M, DEC5M, DEC6M, and DEC7M. A switch SW2M can connect the eight capacitors C6M, C7M, C8M, C9M, C10M, C11M, C12M, and C13M to the common voltage VCM.

A switch SW3M is connected to the output terminal VOUTM and is connectable to the common voltage VCM.

Additionally, in the signal line 51M, capacitors Csplit2 are provided between the capacitors C1M to C13M and the output terminal VOUTM. This weights the D-A converter 50 with respect to the capacitors C1M to C13M with the capacitors Csplit2.

Additionally, in the signal line 51M, a capacitor Csplit1 is provided between the capacitors C1M to C5M and the capacitors C6M to C13M. This further weights the D-A converter 50 with respect to the capacitors C1M to C5M with the capacitor Csplit1.

Switches SW21 and SW22 are provided in each of the above-described connecting portions. In FIG. 9, as a representative example, the switches SW21 and SW22 provided in the connecting portion DEC2M and the switches SW21 and SW22 provided in the connecting portion DEC7M are illustrated. Each of the above-described connecting portions is connected to a reference voltage VREFP by turning on the switch SW21. Each of the above-described connecting portions is connected to a reference voltage VREFN by turning on the switch SW22.

(Example of Binary Codes Used in the D-A Converter 50)

FIG. 10 is a diagram illustrating an example of binary codes used in the D-A converter 50 according to the third embodiment.

In the D-A converter 50 according to the third embodiment, whether the four connecting portions bit0, bit1, bit2, and bit3 illustrated in FIG. 9 are driven or not (that is, whether the switches SW21 and SW22 are switched or not during charge transfer) can be switched by the binary codes illustrated in FIG. 10.

As illustrated in FIG. 10, the possible numerical value range of the binary code in the present embodiment is 0 to 15. Additionally, as illustrated in FIG. 10, each binary code can be represented by a 4-bit binary number. In the present embodiment, the four bits are respectively allocated to the four connecting portions bit0, bit1, bit2, and bit3.

Here, in FIG. 10, a connecting portion whose corresponding bit is "0" indicates that the connecting portion is not driven (that is, the potential of the capacitor connected to the connecting portion is not changed by not switching the switches SW21 and SW22 during charge transfer).

Additionally, in FIG. 10, a connecting portion whose corresponding bit is "1" indicates that the connecting portion is driven (that is, the potential of the capacitor connected to the connecting portion is changed by switching the switches SW21 and SW22 during charge transfer).

In FIG. 10, for each of the four connecting portions bit0, bit1, bit2, and bit3, a capacitance value of a capacitor whose potential is changed due to the switching of the switches SW21 and SW22 (that is, the capacitors C3P, C4P, C5P, and C6P or the capacitors C3M, C4M, C5M, and C6M illustrated in FIG. 9) is illustrated. Here, the capacitors C6P and C6M have a capacitance value equivalent to 0.8 pF due to the weighting of Csplit1.

For example, in the example illustrated in FIG. 10, a capacitance value of a capacitor whose potential is changed by driving the connecting portion bit0 is "0.1 pF". A capacitance value of a capacitor whose potential is changed by driving the connecting portion bit1 is "0.2 pF". Additionally, a capacitance value of a capacitor whose potential is changed by driving the connecting portion bit2 is "0.4 pF". Further, a capacitance value of the capacitor whose potential is changed by driving the connecting portion bit3 is equivalent to 0.8 pF due to the weighting of the capacitor Csplit1.

Thus, in the D-A converter 50 according to the third embodiment, by inputting a binary code from an external controller, the total capacitance value of the capacitors whose potentials are changed by the four connecting portions bit0, bit1, bit2, and bit3 during charge transfer can be suitably set from the outside in a range of 0.0 pF to 1.5 pF in a unit of 0.1 pF.

For example, in the D-A converter 50 according to the third embodiment, by inputting a binary code "3" from the external controller, the two connecting portions bit0 and bit1 are driven during charge transfer, and the total capacitance value of the capacitors changed during charge transfer can be "0.3 pF".

(Example of Thermometer Codes Used in the D-A Converter 50)

FIG. 11 is a diagram illustrating an example of thermometer codes used in the D-A converter 50 according to the third embodiment.

In the D-A converter 50 according to the third embodiment, the seven connecting portions DEC1, DEC2, DEC3, DEC4, DEC5, DEC6, and DEC7 illustrated in FIG. 9 can be switched whether or not to be driven (that is, whether or not to perform switching of the switches SW21 and SW22 during charge transfer) by the thermometer code illustrated in FIG. 11.

As illustrated in FIG. 11, the possible numerical value range of the thermometer codes in the present embodiment is from 0 to 7. As illustrated in FIG. 11, each thermometer code represents the number of connecting portions that are driven during charge transfer.

Here, in FIG. 11, a connecting portion, to which "0" is indicated, indicates that the connecting portion is not driven (that is, the potential of the capacitor connected to the connecting portion is not changed by not switching the switches SW21 and SW22 during charge transfer).

Additionally, in FIG. 11, a connecting portion, to which "1" is indicated, indicates that the connecting portion is driven (that is, the potential of the capacitor connected to the connecting portion is changed by switching the switches SW21 and SW22 during charge transfer).

Here, in FIG. 11, for each of the seven connecting portions DEC1 to DEC7, a capacitance value of a capacitor whose potential is changed due to the switching of the switches SW21 and SW22 (that is, each of the capacitors C7P to C13P or each of the capacitors C7M to C13M illustrated in FIG. 9) is illustrated.

For example, in the example illustrated in FIG. 11, in each of the seven connecting portions DEC1 to DEC7, because the capacitance value of each of the capacitors connected to the connecting portion is "0.2 pF", the capacitance value of the capacitor whose potential is changed by driving the connecting portion is "0.2 pF".

Thus, in the D-A converter 50 according to the third embodiment, by inputting a thermometer code from an external controller, the total capacitance value of the capacitors whose potentials are changed by the seven connecting portions DEC1 to DEC7 during charge transfer can be suitably set from the outside in a unit of 0.2 pF between 0.0 pF and 1.4 pF.

For example, in the D-A converter 50 according to the third embodiment, by inputting a thermometer code "3" from an external controller, the three connecting portions DEC1, DEC2, and DEC3 are driven during charge transfer, and the total capacitance value of the capacitors changed during charge transfer can be set to "0.6 pF".

Here, the binary code illustrated in FIG. 10 uses 4 bits in an 8-bit control code input from an external controller. The thermometer code illustrated in FIG. 11 uses another three bits in the 8-bit control code input from the external controller. That is, the 8-bit control code input from the external controller can simultaneously instruct the binary code and the thermometer code to the D-A converter 50.

In the configuration in which the binary code is used, the total area of the multiple capacitors can be reduced. However, because the variation between the multiple capacitors is relatively large, the accuracy of the offset adjustment may decrease. Conversely, in the configuration in which the thermometer code is used, because the variation between the multiple capacitors becomes relatively small, the accuracy of the offset adjustment can be improved, but the total area of the multiple capacitors may become large. The D-A converter 50 according to the third embodiment includes both the configuration in which the binary code is used and the configuration in which the thermometer code is used, so that the accuracy of the offset adjustment can be improved while suppressing the total area of the multiple capacitors.

Further, the 8-bit control code input from the external controller can specify, by using another one bit, whether the potential of each of the multiple capacitors connected to the output terminal VOUTM and the potential of each of the multiple capacitors connected to the output terminal VOUTP are set to the reference voltage VREFP or the reference voltage VREFN with respect to the D-A converter 50.

For example, when the another one bit in the 8-bit control code is "1", the D-A converter 50 sets potentials (potentials in the first period described later) of multiple capacitors connected to the output terminal VOUTP to the reference voltage VREFN by sampling based on the VCM, and sets potentials (potentials in the first period described later) of multiple capacitors connected to the output terminal VOUTM to the reference voltage VREFP by sampling based on the VCM.

Conversely, when the another one bit in the 8-bit control code is "0", the D-A converter 50 sets the potentials (the potentials in the first period described later) of multiple capacitors connected to the output terminal VOUTP to the reference voltage VREFP by sampling based on the VCM, and sets the potentials (the potentials in the first period described later) of multiple capacitors connected to the output terminal VOUTM to the reference voltage VREFN by sampling based on the VCM.

(Operation of the D-A Converter 50)

Figure 12:
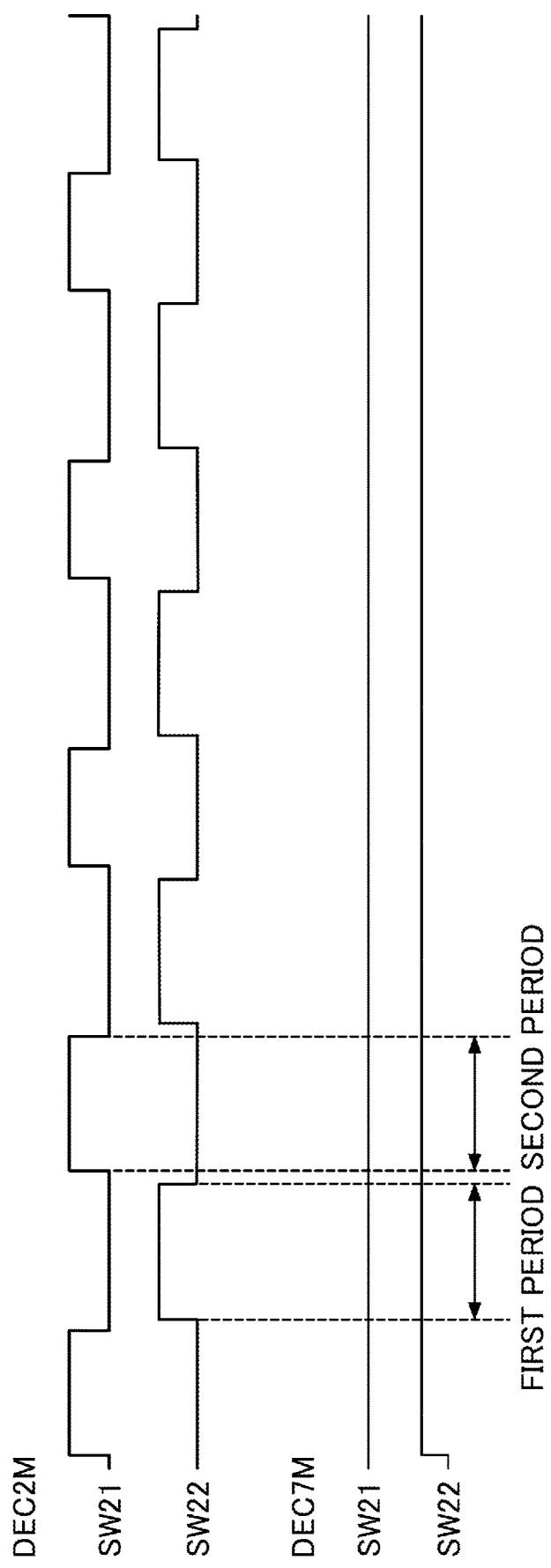
FIG. 12 is a timing chart indicating operation timings of the D-A converter according to the third embodiment.

FIG. 12 is a timing chart indicating operation timings of the D-A converter 50 according to the third embodiment. In FIG. 12, as a representative example, operations of the connecting portion DEC2M and the connecting portion DEC7M are illustrated. Additionally, FIG. 12 illustrates an example in which a connection destination during charge transfer is switched for the connecting portion DEC2M in accordance with a thermometer code input from an external controller, and a connection destination during charge transfer is not switched for the connecting portion DEC7M.

As illustrated in FIG. 12, in the D-A converter 50, the first period and the second period alternately occur.

As illustrated in FIG. 12, in the first period, the connection destination of each of the connection portion DEC2M and the connection portion DEC7M is switched to the reference voltage VREFN by turning on the switch SW22 (see FIG. 9) and turning off the switch SW21 (see FIG. 9).

Thus, in the first period, the potential of each of the capacitor COM (see FIG. 9) connected to the connecting portion DEC2M and the capacitor C13M (see FIG. 9) connected to the connecting portion DEC7M becomes the reference voltage VREFN by sampling based on the VCM.

Additionally, as illustrated in FIG. 12, in the second period, the connection destination of the connecting portion DEC7M remains at the reference voltage VREFN. Therefore, in the second period, the potential of the capacitor C13M connected to the connecting portion DEC7M remains at the reference voltage VREFN. As a result, in the second period, no charges are transferred from the capacitor C13M to the VOUTM.

With respect to the above, in the second period, the connection destination of the connecting portion DEC2M is switched to the reference voltage VREFP by turning off the switch SW22 and turning on the switch SW21. Therefore, in the second period, the potential of the capacitor C8M connected to the connecting portion DEC2M is switched to the reference voltage VREFP. As a result, in the second period, charges are transferred from the capacitor C8M to the VOUTM.

As described above, the D-A converter 50 according to the third embodiment shifts the potential of at least one of the three capacitors C3M to C5M connected to the signal line 51M and the eight capacitors C6M to C13M connected to the signal line 51M from the reference voltage VREFN to the reference voltage VREFP during charge transfer, so that charges can be transferred from the capacitor to the VOUTM. This enables the D-A converter 50 according to the third embodiment to adjust the offset amount of the analog signal (the inverted signal) input to the amplifier AMP through the output terminal VOUTM in accordance with the total capacitance value of the capacitors that transfer charges.

For example, in a case where the offset amount of the analog signal output from the sensor 12 is known in advance, the offset amount of the analog signal input to the amplifier AMP can be set to 0 by instructing, to the D-A converter 50, one or multiple capacitors that perform charge transfer by using an 8 bit control code (including a binary code and a thermometer code) from an external controller so that the offset amount becomes 0.

Here, although the adjustment operation of the offset amount with respect to the non-inverted signal at the output terminal VOUTM of the D-A converter 50 has been described with reference to FIG. 12, the adjustment operation of the offset amount with respect to the inverted signal at the output terminal VOUTP of the D-A converter 50 is the same because the configuration on the non-inverted signal side and the configuration on the inverted signal side are symmetrical in the D-A converter 50 as illustrated in FIG. 9.

That is, the D-A converter 50 according to the third embodiment shifts the potential of at least one of the three capacitors C3P to C5P connected to the signal line 51P and the eight capacitors C6P to C13P connected to the signal line 51P from the reference voltage VREFP to the reference voltage VREFN during charge transfer, so that charges can be transferred from the capacitor to the output terminal VOUTP. This enables the D-A converter 50 according to the third embodiment to adjust the offset amount of the analog signal (the non-inverted signal) input to the amplifier AMP through the output terminal VOUTP in accordance with the total capacitance value of the capacitors that transfer charges.

Here, as illustrated in FIG. 12, a non-overlap period, in which the switch SW21 and the switch SW22 are not turned on at the same time, is provided between the transition from the first period to the second period in the D-A converter 50.

In the first period of the amplifier circuit 22, in the amplifier circuit 22, the analog signals input to the input terminals VIN_P and VIN_M are sampled by the sampling capacitors Cs11 and Cs12, and in the D-A converter 50A, the first period is in effect and the sampling based on the VCM is performed. Additionally, in the first period of the amplifier circuit 22, in the amplifier circuit 22, the analog signals sampled by the sampling capacitors Cs21 and Cs22 are amplified by the amplifier AMP and output from the terminals VOUT_P and VOUT_M, and in the D-A converter 50B, the second period is in effect and the charges are transferred.

In the second period of the amplifier circuit 22, in the amplifier circuit 22, the analog signals input to the input terminals VIN_P and VIN_M are sampled by the sampling capacitors Cs21 and Cs22, and in the D-A converter 50B, the first period is in effect and the sampling based on the VCM is performed. Additionally, in the second period of the amplifier circuit 22, in the amplifier circuit 22, the analog signals sampled by the sampling capacitors Cs11 and Cs12 are amplified by the amplifier AMP and output from the terminals VOUT_P and VOUT_M, and in the D-A converter 50A, the second period is in effect and charges are transferred.

(Operation Principle of the D-A Converter 50)

Figure 13:
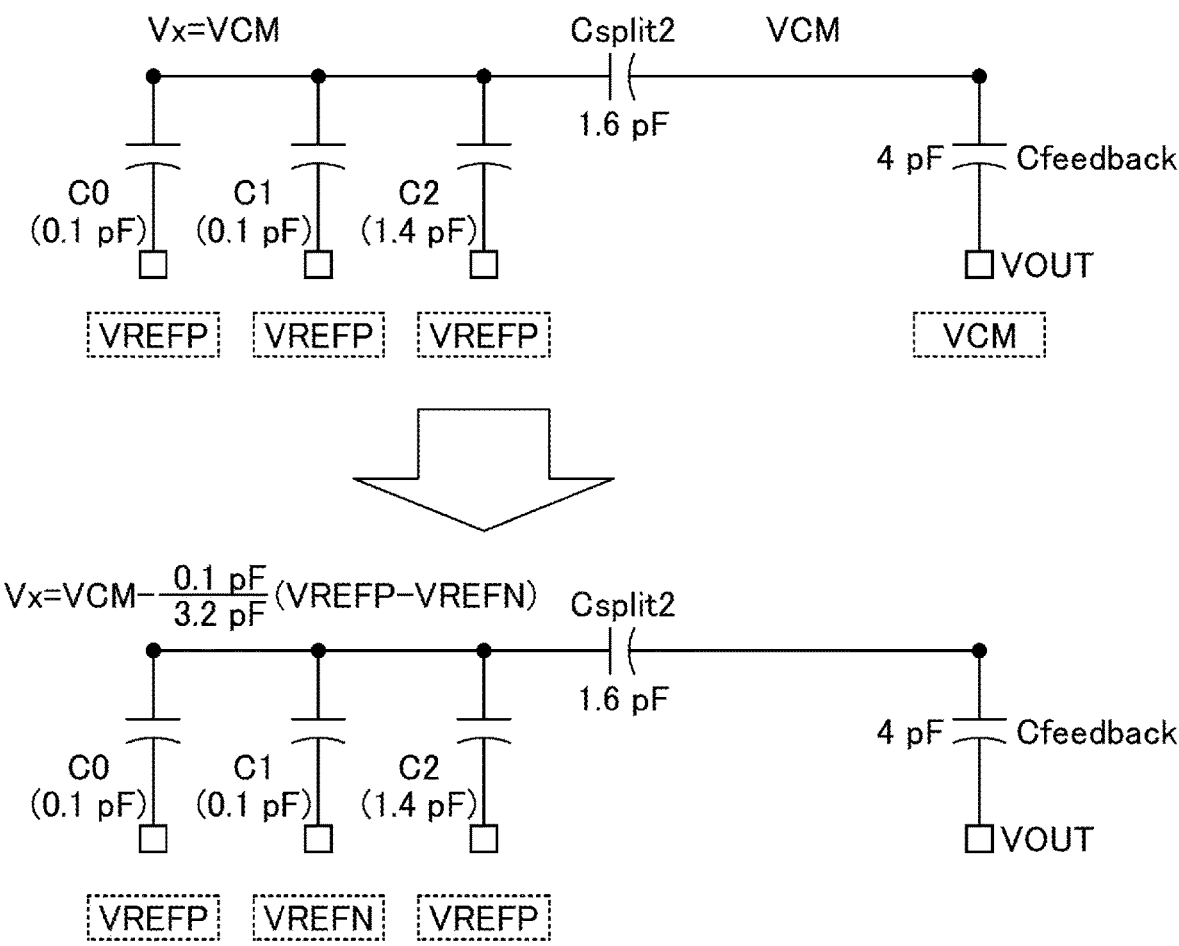
FIG. 13 is a diagram depicting an operation principle of the D-A converter according to the third embodiment.

FIG. 13 is a diagram depicting an operation principle of the D-A converter 50 according to the third embodiment.

In the circuit illustrated in FIG. 13, the total capacitance of the node Vx including capacitors C0, C1, C2, and Csplit2 is 3.2 pF (1.6 pF+0.1 pF+0.1 pF+1.4 pF).

In the circuit illustrated in FIG. 13, when the potential of the capacitor C1 (0.1 pF) changes from the reference voltage VREFP to the reference voltage VREFN during the transfer of the charges sampled in each capacitor, the amount of decrease in the potential at the node Vx is obtained by the following equation (1).

$$0.1 \text{ pF}/3.2 \text{ pF}(VREFP-VREFN) \tag{1}$$

Additionally, in the circuit illustrated in FIG. 13, the amount of change in the output of the output terminal VOUT is determined by the ratio of the capacitances. Therefore, in the circuit illustrated in FIG. 13, the amount of change in the output of the output terminal VOUT is obtained by the following equation (2).

$$\Delta VOUT=0.1 \text{ pF}/3.2 \text{ pF} \times 1.6 \text{ pF}/4 \text{ pF}(VREFP-VREFN)=0.0125(VREFP-VREFN) \tag{2}$$

The D-A converter 50 according to the third embodiment uses this principle to adjust the output of the output terminal VOUT, that is, adjust the offset amount of the analog signal, by changing the potential of one or more capacitors during the transfer of the charges sampled in each capacitor. Although the operation principle has been described using specific numerical values, this is merely an example, and any suitable numerical values can be used.

(Example of the Output Voltage Value of the Analog Signal)

Figure 14:
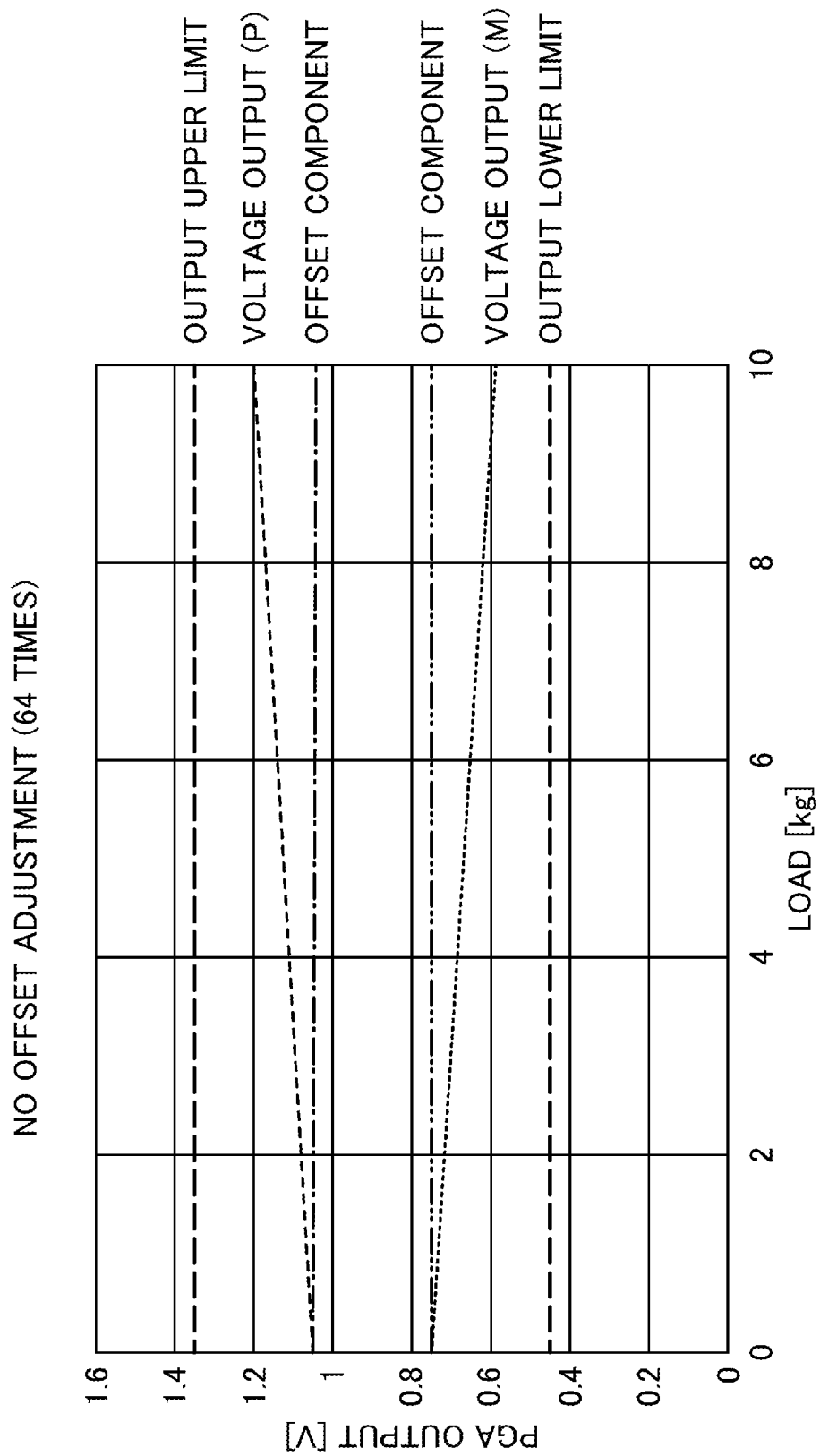
FIG. 14 is a graph indicating an example of output voltage values of analog signals output from an amplifier without the DAC according to the third embodiment.
Figure 15:
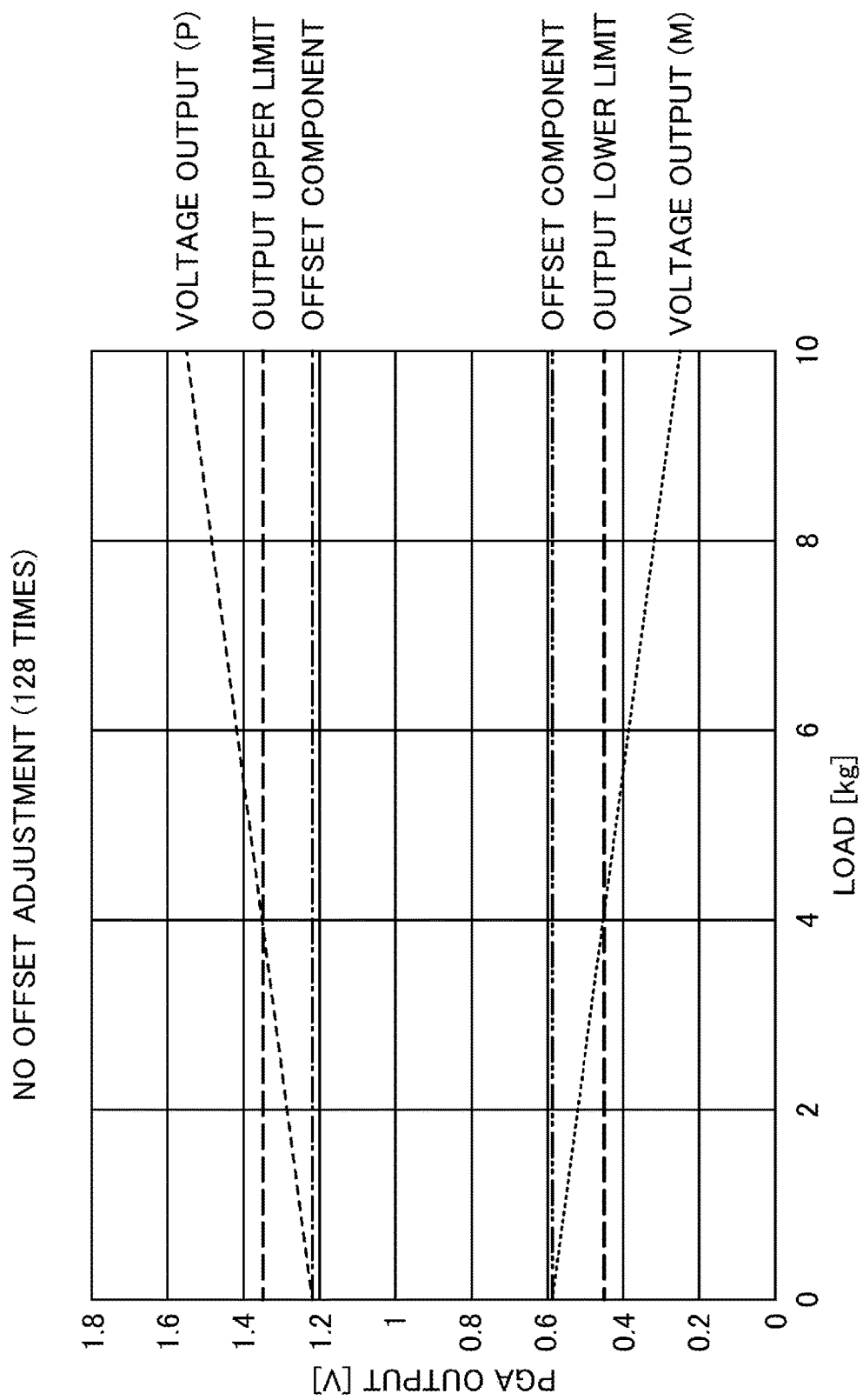
FIG. 15 is a graph indicating an example of output voltage values of analog signals output from an amplifier without the DAC according to the third embodiment.
Figure 16:
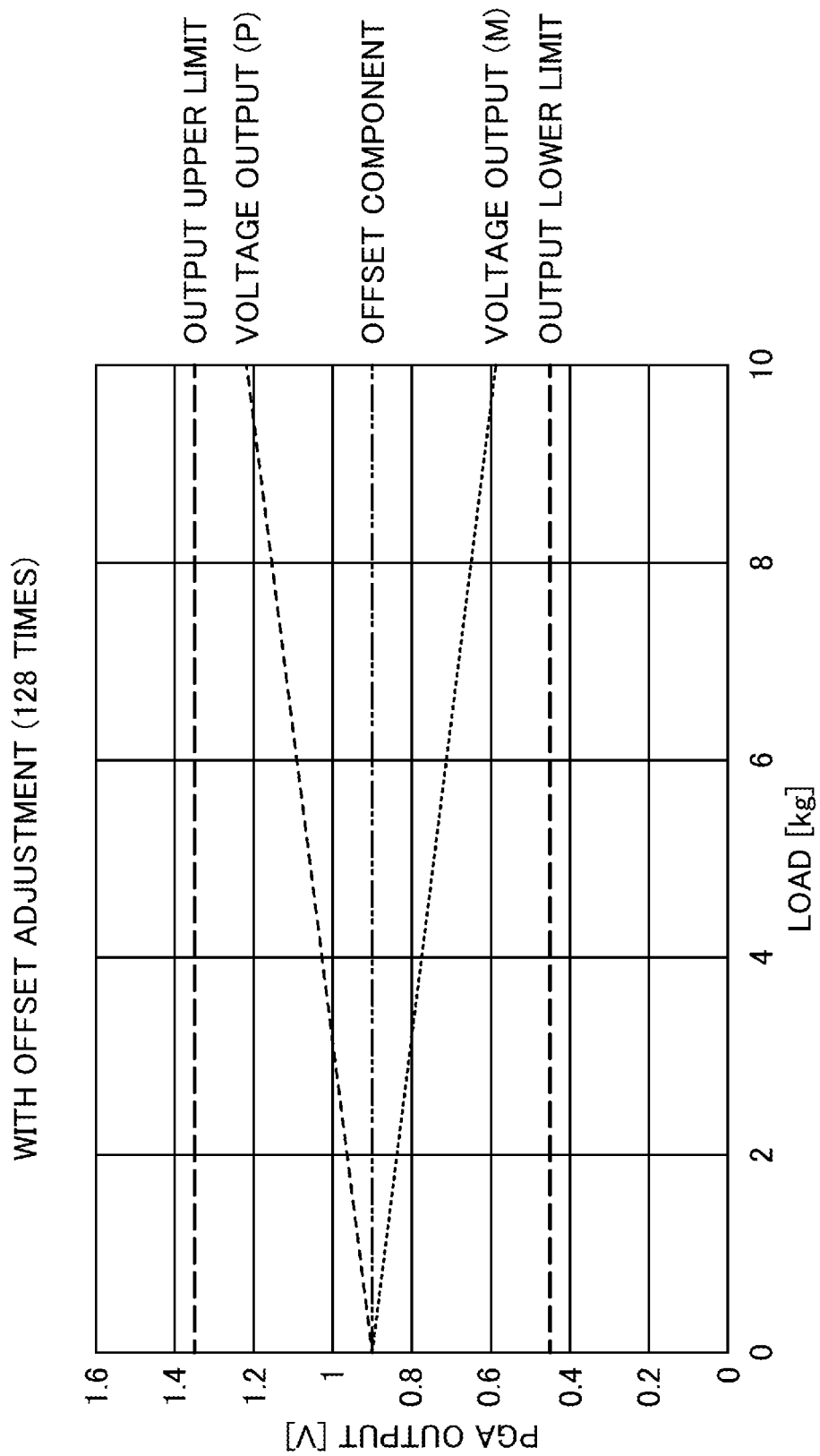
FIG. 16 is a graph indicating an example of output voltage values of analog signals output from an amplifier with the DAC according to the third embodiment.

FIG. 14 and FIG. 15 are graphs each indicating an example of output voltage values of analog signals output from the amplifier AMP when the D-A converter 50 according to the third embodiment is not provided. FIG. 16 is a graph indicating an example of output voltage values of analog signals output from the amplifier AMP when the D-A converter 50 according to the third embodiment is provided.

FIG. 14 indicates an example of the output voltage values of the analog signals when the gain of the amplifier AMP is 64 times. FIG. 15 and FIG. 16 each indicate an example of the output voltage values of the analog signals when the gain of the amplifier AMP is 128 times.

As illustrated in FIG. 15, in the case where the offset adjustment of the D-A converter 50 is not performed, when the analog signals are amplified with a high gain, the offset component is also amplified with a high gain, so that the output voltage values of the analog signal may exceed the upper limit threshold value and the lower limit threshold value.

Conversely, as illustrated in FIG. 16, when the offset components of the analog signals input to the amplifier AMP are set to 0 by performing the offset adjustment of the D-A converter 50, the output voltage values of the analog signals can be prevented from exceeding the upper limit threshold value and the lower limit threshold value because the offset components are not amplified even when the analog signals are amplified with a high gain.

As described above, the IC 20 according to the third embodiment includes the amplifier AMP that amplifies the analog signal, and the D-A converter 50 that is provided in a stage prior to the amplifier AMP and that adjusts the offset amount of the analog signal to be amplified by the amplifier AMP.

This enables the IC 20 according to the third embodiment to reduce the offset amount included in the analog signal output from the amplifier. Therefore, the IC 20 according to the third embodiment can prevent the output voltage value of the analog signal output from the amplifier AMP from exceeding the threshold even when the amplifier AMP amplifies the analog signal with a high gain.

In particular, in the IC 20 according to the third embodiment, the capacitive D-A converter 50 including multiple capacitors is used as the offset adjustment circuit, and the offset amount of the analog signal is adjusted by changing the potential of at least one of the multiple capacitors in accordance with the control code input from the outside.

This enables the IC 20 according to the third embodiment to adjust the offset amount of the analog signal without generating 1/f noise that can be generated when the offset adjustment is performed using an operational amplifier or a current mirror circuit.

Although one embodiment of the present invention has been described in detail above, the present invention is not limited to these embodiments, and various modifications or alterations can be made within the scope of the subject matter of the present invention described in the claims.

For example, in the third embodiment, the D-A converter 50 is provided in the amplifier circuit 22 according to the first embodiment, but the present invention is not limited to this. For example, the D-A converter 50 according to the third embodiment may be provided in an amplifier circuit other than the amplifier circuit 22 according to the first embodiment.

Additionally, in the third embodiment, the D-A converter 50 is provided as an example of the "offset adjustment circuit", but the "offset adjustment circuit" is not limited to this, and may have any configuration as long as the offset amount of the analog signal can be adjusted in a stage prior to the amplifier at least.

Figure 17:
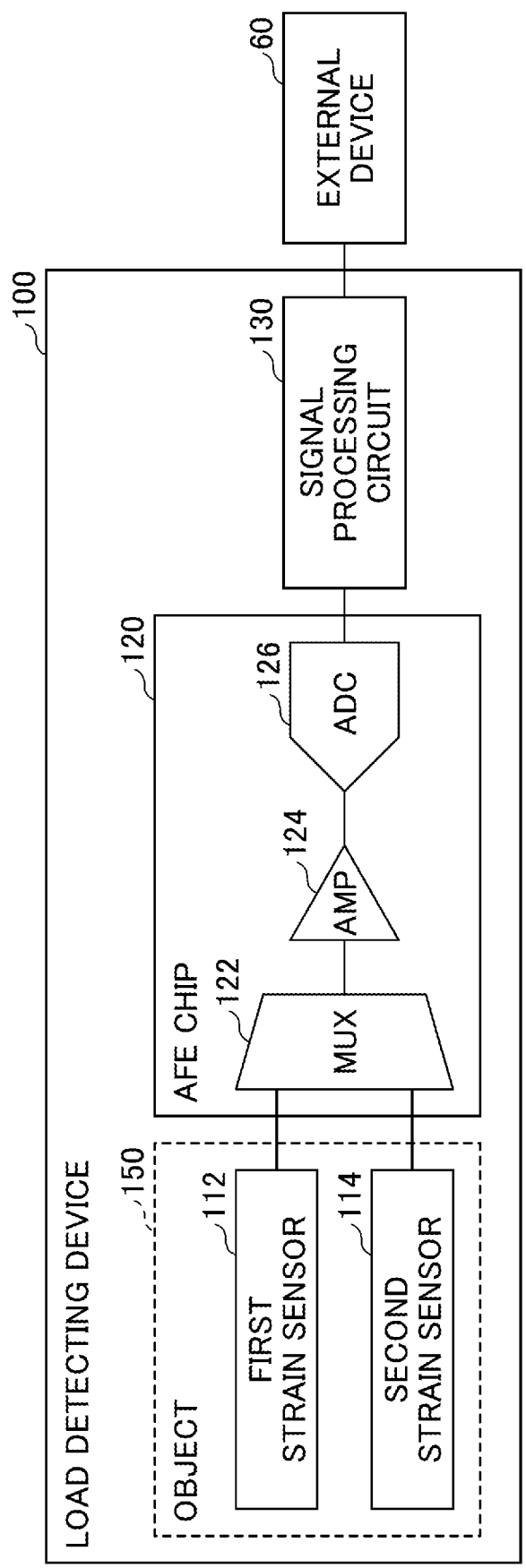
FIG. 17 is a diagram illustrating a configuration of a load detecting device according to one embodiment.

Additionally, FIG. 17 is a diagram illustrating a configuration of a load detecting device 100 according to one embodiment. As illustrated in FIG. 17, the IC 20 described in each of the above-described embodiments is, for example, used as what is called an analog front end (AFE) (the AFE chip 120 illustrated in FIG. 17) that connects strain gauges that output analog signals (strain sensors 112 and 114 illustrated in FIG. 17) to a microcomputer that performs digital processing (the signal processing circuit 130 illustrated in FIG. 17), in the load detecting device 100 that detects a load applied to an object 150. However, the present invention is not limited to this, and the IC 20 may be connected to a sensor other than the strain gauge, and may be used in a system configuration other than the detecting system 10 described in the above embodiments.

This international application claims priority to Japanese Patent Application No. 2020-070473 filed on Apr. 9, 2020, the entire contents of which are incorporated herein by reference.

DESCRIPTION OF THE REFERENCE NUMERALS

10 detecting system
12 sensor
20 IC
22, 22A amplifier circuit (signal processing circuit) AMP amplifier (signal processor)
Cf11, Cf12 feedback capacitor
Cf21, Cf22 feedback capacitor
Cs11, Cs12 sampling capacitor (first sampling capacitor)
Cs21, Cs22 sampling capacitor (second sampling capacitor)
PP1 first switch
PP2 second switch
S/H1 first processor
S/H2 second processor
VIN_P, VIN_M input terminal
VOUT_P, VOUT_M output terminal
24 A-D converter
26 Digital processing circuit
30 MCU
40 averaging filter circuit (signal processing circuit)
42 averaging filter (signal processor)
AVG_FLT1 first processor
AVG_FLT2 second processor
INP, INM input terminal
OUTP, OUTM output terminal
Cs1 to Cs4 first sampling capacitor
Cs5 to Cs8 second sampling capacitor
PP1234 first switch
PP5678 second switch
SW1 to SW8 switch
50 D-A converter (offset adjustment circuit)
VOUTP, VOUTM output terminal
C1P to C13P, C1M to C13M capacitor
Csplit1, Csplit2 capacitor
SW21, SW22 switch
SW1P, SW2P, SW3P switch
SW1M, SW2M, SW3M switch
51P, 51M signal line
VREFN, OSP, OSM connecting portion
bit0P, bit1P, bit2P, bit3P connecting portion
bit0M, bit1M, bit2M, bit3M connecting portion
DEC1P to DEC7P, DEC1M to DEC7M connecting portion

The invention claimed is:

1. A signal processing circuit comprising:
a first sampling capacitor and a second sampling capacitor that are connected for an input signal path of an analog signal;
an offset adjustment circuit, and
a signal processor configured to perform predetermined processing on the analog signal sampled by the first sampling capacitor and the analog signal sampled by the second sampling capacitor,
wherein the sampling of the analog signal transmitted to one capacitor of the first sampling capacitor and the second sampling capacitor, and the predetermined processing performed by the signal processor on the analog signal sampled by another capacitor of the first sampling capacitor and the second sampling capacitor can be performed in parallel,
wherein the signal processor is an amplifier and the predetermined processing is amplification processing using a feedback capacitor, and
wherein the offset adjustment circuit is provided in a stage prior to the amplifier and is configured to adjust an offset amount of the analog signal to be amplified by the amplifier.

2. The signal processing circuit as claimed in claim 1, wherein a first period and a second period alternately occur,
wherein in the first period, the analog signal is sampled by the first sampling capacitor and the predetermined processing is performed by the signal processor on the analog signal sampled by the second sampling capacitor, and
wherein in the second period, the analog signal is sampled by the second sampling capacitor and the predetermined processing is performed by the signal processor on the analog signal sampled by the first sampling capacitor.

3. The signal processing circuit as claimed in claim 2,
wherein in the first period, by turning on a plurality of first switches, the input signal path is connected to the first sampling capacitor and the second sampling capacitor is connected to the signal processor, and
wherein in the second period, by turning on a plurality of second switches, the input signal path is connected to the second sampling capacitor and the first sampling capacitor is connected to the signal processor.

4. The signal processing circuit as claimed in claim 1, wherein a data rate of the analog signal that is output is twice greater than a data rate obtained when the sampling is performed by either the first sampling capacitor or the second sampling capacitor only.

5. The signal processing circuit as claimed in claim 1, wherein the signal processor is an averaging filter and the predetermined processing is averaging filter processing.

6. A signal processing circuit comprising:
a first sampling capacitor and a second sampling capacitor that are connected for a first input signal path of a first analog signal;
a plurality of first switches and a plurality of second switches;
a first feedback capacitor connected in series to the first sampling capacitor and a second feedback capacitor connected in series to the second sampling capacitor; and
a signal processor configured to perform predetermined processing on the first analog signal sampled by the first sampling capacitor and the first analog signal sampled by the second sampling capacitor,
wherein the sampling of the first analog signal transmitted to one capacitor of the first sampling capacitor and the second sampling capacitor, and the predetermined processing performed by the signal processor on the first analog signal sampled by another capacitor of the first sampling capacitor and the second sampling capacitor can be performed in parallel;
wherein a first period and a second period alternately occur;
wherein in the first period, the first analog signal is sampled by the first sampling capacitor and the predetermined processing is performed by the signal processor on the first analog signal sampled by the second sampling capacitor;
wherein in the second period, the first analog signal is sampled by the second sampling capacitor and the predetermined processing is performed by the signal processor on the first analog signal sampled by the first sampling capacitor;
wherein in the first period, by turning on the plurality of first switches, the first input signal path is connected to the first sampling capacitor and the second sampling capacitor is connected to the signal processor;
wherein in the second period, by turning on the plurality of second switches, the first input signal path is connected to the second sampling capacitor and the first sampling capacitor is connected to the signal processor;
wherein the signal processor is an amplifier and the predetermined processing is amplification processing using the first feedback capacitor and the second feedback capacitor;
wherein in the first period, by turning on the plurality of first switches, the first analog signal sampled by the second sampling capacitor is transferred to the second feedback capacitor; and
wherein in the second period, by turning on the plurality of second switches, the first analog signal sampled by the first sampling capacitor is transferred to the first feedback capacitor.

7. The signal processing circuit as claimed in claim 6, wherein a data rate of the first analog signal that is output is twice greater than a data rate obtained when the sampling is performed by either the first sampling capacitor or the second sampling capacitor only.

8. The signal processing circuit as claimed in claim 6, further comprising an offset adjustment circuit that is provided in a stage prior to the amplifier and that is configured to adjust an offset amount of the first analog signal to be amplified by the amplifier.

9. The signal processing circuit as claimed in claim 6, further comprising:
a third sampling capacitor and a fourth sampling capacitor that are connected for a second input signal path of a second analog signal;
a third feedback capacitor connected in series to the third sampling capacitor and a fourth feedback capacitor connected in series to the fourth sampling capacitor;
a first output terminal that outputs the first analog signal processed by the signal processor; and
a second output terminal that outputs the second analog signal processed by the signal processor;
wherein the signal processor is configured to perform the predetermined processing on the second analog signal sampled by the third sampling capacitor and the second analog signal sampled by the fourth sampling capacitor,
wherein in the first period, the second analog signal is sampled by the third sampling capacitor and the predetermined processing is performed by the signal processor on the second analog signal sampled by the fourth sampling capacitor;
wherein in the second period, the second analog signal is sampled by the fourth sampling capacitor and the predetermined processing is performed by the signal processor on the second analog signal sampled by the third sampling capacitor;
wherein in the first period, by turning on the first switches, the second input signal path is connected to the third sampling capacitor, and the fourth sampling capacitor is connected to the signal processor, and
wherein in the second period, by turning on the second switches, the second input signal path is connected to the fourth sampling capacitor, and the third sampling capacitor is connected to the signal processor.

* * * * *